US010980096B2

(12) United States Patent
Summers et al.

(10) Patent No.: US 10,980,096 B2
(45) Date of Patent: Apr. 13, 2021

(54) LEARNING A LIGHTING PREFERENCE BASED ON A REACTION TYPE

(71) Applicant: Lexi Devices, Inc., Berkeley, CA (US)

(72) Inventors: Alexander Charles Summers, Menlo Park, CA (US); Collin James Palmer, San Mateo, CA (US); David Brian Lindell, Stanford, CA (US); Michael Pickett McKenna, Atherton, CA (US)

(73) Assignee: Lexi Devices, Inc., Berkeley, CA (US)

( * ) Notice: Subject to any disclaimer, the term of this patent is extended or adjusted under 35 U.S.C. 154(b) by 0 days.

(21) Appl. No.: 16/740,332

(22) Filed: Jan. 10, 2020

(65) Prior Publication Data

US 2020/0229286 A1 Jul. 16, 2020

Related U.S. Application Data

(60) Provisional application No. 62/918,032, filed on Jan. 15, 2019, provisional application No. 62/791,452, filed on Jan. 11, 2019.

(51) Int. Cl.
| | |
|---|---|
| *G06K 9/00* | (2006.01) |
| *H05B 47/175* | (2020.01) |
| *H04Q 9/00* | (2006.01) |
| *H05B 47/16* | (2020.01) |
| *H05B 47/11* | (2020.01) |

(Continued)

(52) U.S. Cl.
CPC ........... *H05B 47/175* (2020.01); *G06F 30/12* (2020.01); *G06F 30/13* (2020.01); *G06K 9/00335* (2013.01); *G06K 9/6259* (2013.01); *G06N 3/08* (2013.01); *H04L 12/282* (2013.01); *H04Q 9/00* (2013.01); *H05B 47/11* (2020.01); *H05B 47/115* (2020.01); *H05B 47/12* (2020.01); *H05B 47/125* (2020.01); *H05B 47/155* (2020.01); *H05B 47/16* (2020.01); *G06F 3/167* (2013.01)

(58) Field of Classification Search
CPC .... G06K 9/00335; G06K 9/6259; G06N 3/08; H05B 47/12; H05B 47/125; H04L 12/282; G06F 3/167
See application file for complete search history.

(56) References Cited

U.S. PATENT DOCUMENTS

| | | | | |
|---|---|---|---|---|
| 2013/0120238 | A1* | 5/2013 | Spaulding | H05B 47/105 345/156 |
| 2015/0296594 | A1* | 10/2015 | Blum | H05B 45/20 315/158 |

(Continued)

*Primary Examiner* — Borna Alaeddini
(74) *Attorney, Agent, or Firm* — Steven Stupp

(57) ABSTRACT

During operation, a computer provides, based at least in part on an initial lighting preference of an individual, instructions specifying initial lighting states of one or more lights in a lighting configuration in an environment, where an initial lighting state of a given light includes an intensity and a color of the given light. Then, the computer receives sensor data specifying a non-verbal physical response of the individual to initial lighting states. Moreover, the computer determines, based at least in part on the non-verbal physical response, a type of reaction of the individual to the initial lighting state. Next, the computer selectively modifies, based at least in part on a lighting behavior history of the individual and the determined type of reaction, the initial lighting preference of the individual to obtain an updated lighting preference.

20 Claims, 12 Drawing Sheets

(51) Int. Cl.
  *H05B 47/115* (2020.01)
  *H05B 47/12* (2020.01)
  *H05B 47/125* (2020.01)
  *G06K 9/62* (2006.01)
  *G06N 3/08* (2006.01)
  *H04L 12/28* (2006.01)
  *G06F 30/13* (2020.01)
  *G06F 30/12* (2020.01)
  *H05B 47/155* (2020.01)
  *G06F 3/16* (2006.01)

(56) References Cited

U.S. PATENT DOCUMENTS

| | | | |
|---|---|---|---|
| 2016/0366746 A1* | 12/2016 | van de Ven | H05B 45/20 |
| 2017/0139582 A1* | 5/2017 | Maricic | H05B 47/125 |
| 2017/0285594 A1* | 10/2017 | Stewart | H05B 47/175 |
| 2018/0232571 A1* | 8/2018 | Bathiche | G10L 15/24 |
| 2018/0306431 A1* | 10/2018 | Watanabe | F21V 33/0052 |
| 2019/0021155 A1* | 1/2019 | Van De Sluis | H05B 45/00 |
| 2019/0034043 A1* | 1/2019 | Zolotykh | G06F 3/04812 |

* cited by examiner

LEARNING A LIGHTING PREFERENCE BASED ON A REACTION TYPE

CROSS REFERENCE TO RELATED APPLICATIONS

This application claims priority under 35 U.S.C. 119(e) to U.S. Provisional Application Ser. No. 62/918,032, "Activity Recognition and Analysis Through Computer Vision," by Michael Pickett McKenna, etc., filed on Jan. 15, 2019, and to U.S. Provisional Application Ser. No. 62/791,452, "Machine Learning Method for Smart Lighting Device and Smart Lighting Control, Composition and Personalization," by Scott Cahill, filed on Jan. 11, 2019, the contents of both of which are herein incorporated by reference.

FIELD

The described embodiments relate to techniques for dynamically learning a lighting preference of an individual based at least in part on a type of reaction of the individual.

BACKGROUND

Trends in connectivity and in portable electronic devices are resulting in dramatic changes in people's lives. For example, increasingly powerful computing and communication capabilities of being included in electronic devices that are located throughout people's homes. In turn, these capabilities can enable the so-called 'Internet of things,' in which background electronic devices can communicate with each other and can access information to enable a wide variety of functions and services.

Much of the attention in the Internet of things has focused on adding such intelligence and communication capabilities in electronic door locks and smart thermostats. However, the typical home often only has a small number of instances of these devices at particular locations in the home. On the other hand, there are usually at least dozens of lights located through a home. In principle, adding computing and communication capabilities to lights (which is sometimes referred to as a 'smart light') offers the prospect of a significant and pervasive impact on users in environments throughout the home.

In practice, it has proven difficult to achieve these goals. Notably, it is often difficult to design, integrate and control many existing lights. For example, many existing lighting platforms or systems have limited functionality with user-interfaces that are cumbersome, confusing and/or time-consuming to use. These problems often degrade the user experience, increase user frustration and limit adoption of smart lighting and associated systems.

SUMMARY

In a first group of embodiments, a computer that dynamically learns a lighting preference of an individual is described. This computer includes: an interface circuit; a computation device (such as a processor, a processor core, a graphics processing unit, etc.) that executes program instructions; and memory that stores the program instructions. During operation, the computer provides, based at least in part on an initial lighting preference of the individual, instructions specifying initial lighting states of one or more lights in a lighting configuration in an environment to the one or more lights in the environment, where the lighting configuration includes the one or more lights (or types of lights) at predefined or predetermined locations in the environment, and an initial lighting state of a given light includes an intensity and a color of the given light. Then, the computer receives sensor data specifying a non-verbal physical response of the individual to initial lighting states of the one or more lights. Moreover, the computer determines, based at least in part on the non-verbal physical response, a type of reaction of the individual to the initial lighting state. Next, based at least in part on a lighting behavior history of the individual and the determined type of reaction, the computer selectively modifies the initial lighting preference of the individual to obtain an updated lighting preference.

In some embodiments, the computer provides, based at least in part on the updated lighting preference, second instructions specifying second lighting states of the one or more lights in the lighting configuration in the environment to the one or more lights, where the second lighting states Are different from the initial lighting states. Moreover, the instructions or the second instructions may be provided via a control hub. Alternatively, the computer may be the control hub.

Note that the sensor data may include an image or a video of at least a portion of the individual. Moreover, the determining of the non-verbal physical response may involve analyzing the image or the video using an image-processing technique. For example, the image-processing technique may include a pretrained neural network or a machine-learning model, where the image-processing technique uses the image or the video and/or features in the image or the video as inputs, and outputs the type of reaction. Note that the features in the image or the video may be determined using at least one of: a discrete Fourier transform, principal component analysis or a Joint Photographic Experts Group (JPEG) analysis. More generally, the features may be determined using a feature extraction technique. Alternatively or additionally, the sensor data may include sound.

Furthermore, the computer may modify the initial lighting preference when the type of reaction is negative.

Additionally, the lighting behavior history may include prior instances of verbal or natural-language commands corresponding to prior lighting states of one or more lighting configurations associated with the individual and/or feedback about the prior lighting states of the one or more lighting configurations associated with the individual. For example, the feedback may include changes to the prior lighting states of the one or more lighting configurations.

In some embodiments, the determining of the type of reaction and the modifying of the initial lighting preference may involve a generative adversarial network (GAN).

Note that the non-verbal physical response may include a facial expression, a gesture, posture, gait, motion, a gaze or viewing direction, a viewing distance relative to printed material or a display, an eyebrow position, a pupil response, etc. Moreover, the non-verbal physical response may include a type of sound other than a verbal or natural-language command associated with the individual.

Furthermore, the receiving of the sensor data may involve the computer measuring the sensor data, such as by acquiring the image, the video, and/or the sound.

Another embodiment provides a computer-readable storage medium for use in conjunction with the computer. This computer-readable storage medium includes the program instructions for at least some of the operations performed by the computer.

Another embodiment provides a method for dynamically learning a lighting preference of an individual. The method includes at least some of the aforementioned operations performed by the computer.

In a second group of embodiments, a computer that automatically changes a lighting configuration is described. This computer includes: an interface circuit; a computation device (such as a processor, a processor core, a graphics processing unit, etc.) that executes program instructions; and memory that stores the program instructions. During operation, the computer receives one or more images of an environment. Then, the computer receives information specifying an initial lighting configuration in the environment, where the initial lighting configuration includes one or more lights (or types of lights) at predefined or predetermined locations in the environment, dynamic lighting states of the one or more lights, and a dynamic lighting state of the given light includes an intensity and a color of the given light. Based at least in part on the initial lighting configuration and a layout of the environment specified by the one or more images, the computer generates and provides a simulation of the environment with the initial lighting configuration. Moreover, the computer analyzes the one or more images using an image-analysis technique to determine a context associated with the environment. Then, based at least in part on the initial lighting configuration, the layout of the environment, and the determined context, the computer modifies the initial lighting configuration to obtain an updated lighting configuration. Next, based at least in part on the updated lighting configuration and the layout, the computer generates an updated simulation of the environment with the updated lighting configuration. Furthermore, the computer selectively provides the updated simulation.

For example, the information specifying the initial lighting configuration may include user-interface activity associated with a user interface, e.g., which may be received from an individual that interacted with the user interface. Moreover, the computer may provide the updated simulation in response to user-interface activity associated with the user interface that specifies selection of the updated lighting configuration.

Furthermore, the simulation or the updated simulation may be provided using augmented or virtual reality. For example, the computer may provide information specifying the simulation or the updated simulation, or may display the simulation or the updated simulation on a display.

Note that the computer may analyze the one or more images to determine the layout of the environment using an image-analysis technique. Additionally, the computer may analyze the one or more images using the image-analysis technique to identify one or more related environments having attributes that are approximately the same as (or similar to) the environment, which may be associated with one or more additional individuals, and the updated lighting configuration may be based at least in part on the one or more related environments.

Note that the context may include: a timestamp (such as a time of day, a day of the week, a month, etc.), a natural lighting condition in the environment (such as a natural light intensity), a location and state of a configurable object in the environment (such as a shade, a curtain or a display), a location of a display in the environment, a type of object in the environment, a style associated with the environment, etc.

Moreover, the image-processing technique may include a pretrained neural network or a machine-learning model, where the image-processing technique uses the one or more images and/or features in the one or more images as inputs, and outputs the context. Note that the features in the one or more images may be determined using at least one of: a discrete Fourier transform, principal component analysis or a JPEG analysis. More generally, the features may be determined using a feature extraction technique.

Furthermore, the receiving of the one or more images may involve the computer acquiring the one or more images.

Another embodiment provides a computer-readable storage medium for use in conjunction with the computer. This computer-readable storage medium includes the program instructions for at least some of the operations performed by the computer.

Another embodiment provides a method for automatically changing a lighting configuration. The method includes at least some of the aforementioned operations performed by the computer.

In a third group of embodiments, a computer that automatically determines dynamic lighting states is described. This computer includes: an interface circuit; a computation device (such as a processor, a processor core, a graphics processing unit, etc.) that executes program instructions; and memory that stores the program instructions. During operation, the computer obtains information specifying a lighting configuration of one or more lights in an environment, where the lighting configuration includes the one or more lights (or types of lights) at predefined or predetermined locations in the environment. Then, the computer receives sensor data associated with the environment. Moreover, the computer analyzes the sensor data to determine a context associated with the environment. Then, based at least in part on the lighting configuration, a layout of the environment, and the determined context, the computer automatically determines the dynamic lighting states of the one or more lights, where a dynamic lighting state of a given light includes an intensity and a color of the given light. Next, the computer provides instructions corresponding to the dynamic lighting states to the one or more lights.

Note that obtaining the information specifying the lighting configuration may involve accessing the information in the memory. Moreover, the computer may provide the instructions to the one or more lights via a control hub. Alternatively, the computer may be the control hub.

Moreover, the context may include: a timestamp (such as a time of day, a day in a week, a month, etc.), a state of one or more objects in the environment (such as a shade or a curtain, a display, etc.), a number of individuals in the environment, whether an electronic device in the environment is powered on while or whether individuals are present or absent from the environment, locations of one or more individuals in the environment, e.g., relative to one or more second objects in the environment (such as furniture), activities of the one or more individuals (such as reading, sleeping, moving, a predefined type of activity, etc.), start and/or stop times of the activities, a natural lighting condition, etc. In some embodiments, the context includes an identity of an individual, and the dynamic lighting states may be based at least in part on a lighting preference or a history of lighting configurations associated with the individual.

Furthermore, the sensor data may include one or more images, and the computer may analyze the one or more images using an image-processing technique. The image-processing technique may include a pretrained neural network or a machine-learning model, where the image-processing technique uses the one or more images and/or features in the one or more images as inputs, and outputs the context. Note that the features in the one or more images may be determined using at least one of: a discrete Fourier transform, principal component analysis or a JPEG analysis. More generally, the features may be determined using a feature extraction technique. In some embodiments, the sensor data includes: sound, sensor data associated with a wearable device, temperature measurements from a thermal sensor, a Lidar measurement, a measurement from another connected or Internet-of-things device, etc.

Additionally, the analysis may identify one or more related environments having attributes that are approximately the same as the environment (and which may be associated with the individual and/or one or more additional individuals), and the dynamic lighting states may be based at least in part on lighting configurations and/or lighting states of the one or more related environments.

In some embodiments, the receiving of the sensor data may involve the computer acquiring or measuring the sensor data (such as the one or more images).

Moreover, in some embodiments, based at least in part on the dynamic lighting states, the computer selectively performs a remedial action. For example, the computer may provide a reminder or a notification. Alternatively or additionally, a reminder or notification may be provided based at least in part on a context of one or more activities in an environment (such as a home).

Furthermore, the dynamic lighting states may be based at least in part on a transferrable lighting profile with one or more lighting preferences of the individual. For example, the individual may have a transient or finite duration of association with the environment (such as a hotel room), and the transferrable lighting profile of the individual may be associated with one or more second environments that are different from the environment (such as the individual's home). More generally, a transferrable profile may encompass settings associated with an activity, which may be in addition to or instead of the one or more lighting preferences.

Additionally, the computer may calibrate the one or more lights, where the calibration involves varying the intensity and the color (or color temperature) of the given light using a set of different intensities and colors, and where the calibration assesses an impact of the dynamic lighting states of the one or more lights. Moreover, the dynamic lighting states may be determined based at least in part on the calibration and a predefined lighting design principle.

Another embodiment provides a computer-readable storage medium for use in conjunction with the computer. This computer-readable storage medium includes the program instructions for at least some of the operations performed by the computer.

Another embodiment provides a method for automatically determining dynamic lighting states. The method includes at least some of the aforementioned operations performed by the computer.

This Summary is provided for purposes of illustrating some exemplary embodiments, so as to provide a basic understanding of some aspects of the subject matter described herein. Accordingly, it will be appreciated that the above-described features are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

The included drawings are for illustrative purposes and serve only to provide examples of possible structures and arrangements for the disclosed systems and techniques. These drawings in no way limit any changes in form and detail that may be made to the embodiments by one skilled in the art without departing from the spirit and scope of the embodiments. The embodiments will be readily understood by the following detailed description in conjunction with the accompanying drawings, wherein like reference numerals designate like structural elements.

Note that like reference numerals refer to corresponding parts throughout the drawings. Moreover, multiple instances of the same part are designated by a common prefix separated from an instance number by a dash.

DETAILED DESCRIPTION

Figure 1:
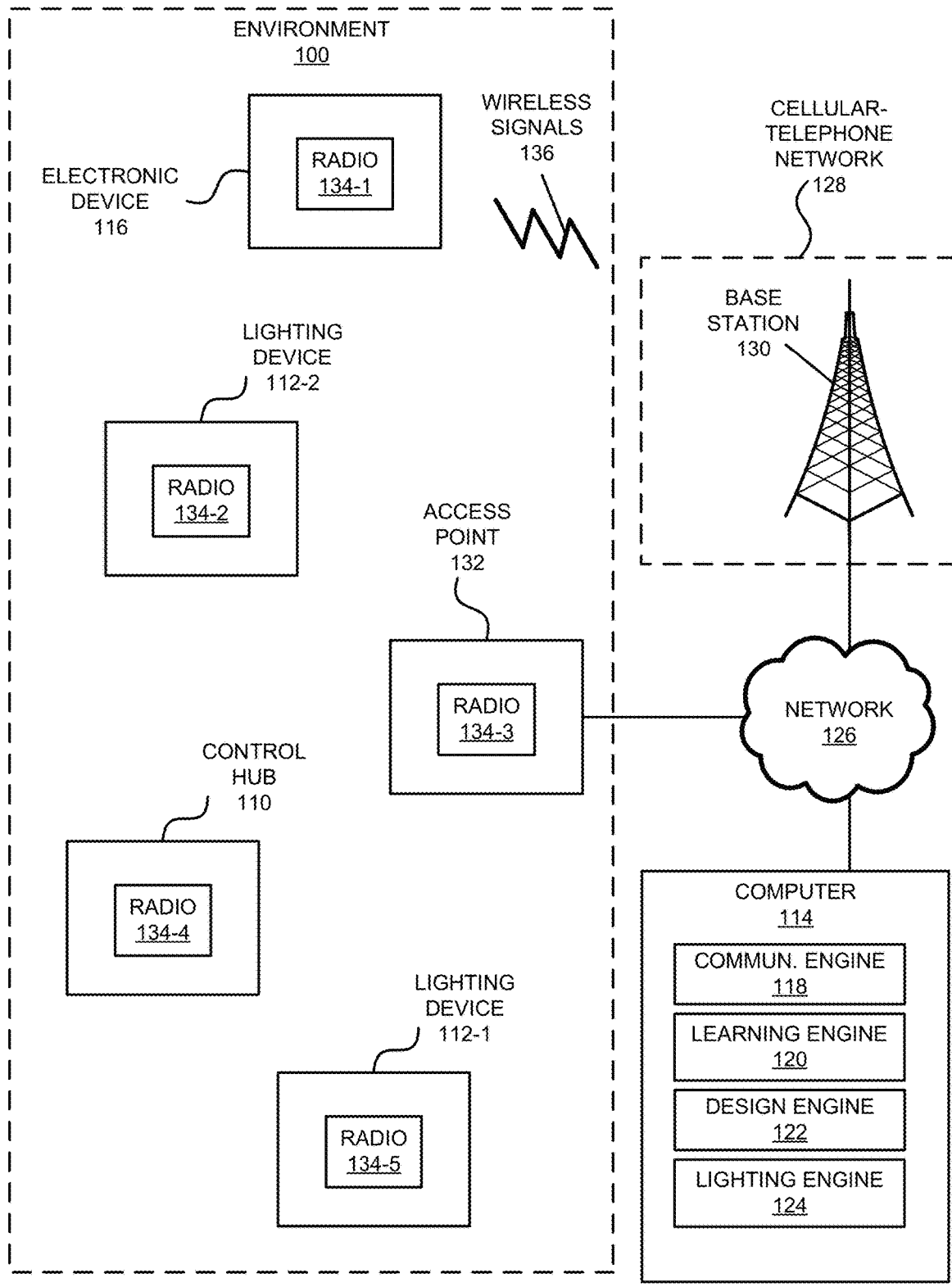
FIG. 1 is a drawing illustrating an example of a lighting system in accordance with an embodiment of the present disclosure.

In a first group of embodiments, a computer that dynamically learns a lighting preference of an individual is described. During operation, the computer may provide, based at least in part on an initial lighting preference of an individual, instructions specifying initial lighting states of one or more lights in a lighting configuration in an environment, where the lighting configuration may include the one or more lights (or types of lights) at predefined or predetermined locations in the environment, and an initial lighting state of a given light may include an intensity and a color of the given light. Then, the computer may receive sensor data specifying a non-verbal physical response of the individual to initial lighting states of the one or more lights. Moreover, the computer may determine, based at least in part on the non-verbal physical response, a type of reaction of the individual to the initial lighting state. Next, the computer may selectively modify, based at least in part on a lighting behavior history of the individual and/or the determined type of reaction, the initial lighting preference of the individual to obtain an updated lighting preference.

By dynamically learning the lighting preference of the individual, these lighting techniques allow a lighting system that includes the one or more lights to appropriately adapt to and to anticipate or predict a future instance of the lighting state. Consequently, the lighting system may automatically and accurately determine the future instance of the lighting state. Therefore, the lighting techniques may facilitate improved service, and may enhance the user experience of the individual when using the lighting system.

In a second group of embodiments, a computer that automatically changes a lighting configuration is described. During operation, the computer may generate, based at least in part on an initial lighting configuration in an environment and a layout of the environment, and may provide a simulation of the environment with the initial lighting configuration. Note that the initial lighting configuration may include one or more lights (or types of lights) at predefined or predetermined locations in the environment, and dynamic lighting states of the one or more lights, and a dynamic lighting state of the given light may include an intensity and a color of the given light. Moreover, based at least in part on the initial lighting configuration, the layout of the environment, and a determined context of the environment from one or more images of the environment, the computer may modify the initial lighting configuration to obtain an updated lighting configuration. Next, based at least in part on the updated lighting configuration and the layout, the computer may generate and may selectively provide an updated simulation of the environment with the updated lighting configuration. For example, the simulation or the updated simulation may be provided using augmented or virtual reality.

By automatically changing the lighting configuration, these lighting techniques may present more interesting or relevant lighting configurations to the individual. For example, the computer may analyze the one or more images of the environment using an image-analysis technique to identify one or more related environments having attributes that are at least approximately the same as (or similar to) the environment, and the updated lighting configuration may be based at least in part on the one or more related environments. Consequently, the lighting techniques may assist the individual in designing and obtaining an improved lighting configuration for the environment. Therefore, the learning techniques may facilitate improved service, and may enhance the user experience when using the lighting system.

In a third group of embodiments, a computer that automatically determines dynamic lighting states is described. During operation, the computer may obtain information specifying a lighting configuration of one or more lights in an environment, where the lighting configuration may include the one or more lights (or types of lights) at predefined or predetermined locations in the environment. Then, the computer may receive sensor data associated with the environment. Moreover, the computer may analyze the sensor data to determine a context associated with the environment. Then, based at least in part on the lighting configuration, a layout of the environment, and the determined context, the computer may automatically determine the dynamic lighting states of the one or more lights, where a dynamic lighting state of a given light includes an intensity and a color of the given light. Next, the computer may provide instructions corresponding to the dynamic lighting states to the one or more lights.

By automatically determining the dynamic lighting states, these lighting techniques may provide an appropriate or suitable lighting condition to an individual for the current conditions or circumstances in the environment. For example, the computer may calibrate the one or more lights by varying the intensity and the color of the given light using a set of different intensities and colors, may assess an impact of the dynamic lighting states of the one or more lights. Then, the dynamic lighting states may be determined based at least in part on the calibration and a predefined lighting design principle. Consequently, the lighting techniques may assist the individual in obtaining improved lighting states for the environment. Therefore, the learning techniques may facilitate improved service, and may enhance the user experience when using the lighting system.

In the discussion that follows, a dynamic and flexible user interface and lighting system for designing and controlled lights (such as light emitting diodes or LEDs) is described. The lighting system or platform (which is sometimes referred to as the 'Lexi system' or the 'Lexi platform') is user friendly and allows users to efficiently (i.e., with reduced time, effort and/or expense) create customized lighting configurations (in which the number, type and locations of one or more lights may be arbitrarily and/or dynamically changed or adapted) and lighting patterns or lighting states for particular environments (such as a room) and/or to identify predefined lighting configurations and light patterns for use in these environments.

Moreover, in the discussion that follows, an individual or a user may be a person. In some embodiments, the lighting techniques are used by a type of organization instead of a user, such as a business (which should be understood to include a for-profit corporation, a non-profit corporation or another type of business entity), a group (or a cohort) of individuals, a sole proprietorship, a government agency, a partnership, etc.

Furthermore, in the following discussion, an image may include one or more of: a two-dimensional (2D) image, a 2.5D image, a 3D image (e.g., with stereoscopic information or a hologram), etc. In some embodiments, an image may be compatible with a wide variety of different resolutions and/or file formats, such as JPEG, a Tagged Image File Format (TIFF), a Graphics Interchange Format (GIF), a bitmap file format (such as BMP), a Portable Network Graphics (PNG) file format, another file format, etc.

In the discussion that follows, note that 'dynamic' may indicate time-varying within a given instance of a lighting configuration or a lighting state. Alternatively or additionally, 'dynamic' may indicate time-invariant within a given instance of a lighting configuration or a lighting state, but may be different or changed in different instances of lighting configurations or lighting states.

Additionally, in the discussion that follows, electronic devices and/or components in the computer (or a computer system) may communicate using a wide variety of communication protocols. For example, the communication may involve wired or wireless communication. Consequently, the communication protocols may include one or more of: an Institute of Electrical and Electronics Engineers (IEEE) 802.11 standard (which is sometimes referred to as 'Wi-Fi®,' from the Wi-Fi Alliance of Austin, Tex.), Bluetooth™ (from the Bluetooth Special Interest Group of Kirkland, Wash.), Bluetooth Low Energy or BLE (from the Bluetooth Special Interest Group of Kirkland, Wash.), Zigbee (from the Zigbee Alliance of Davis, Calif.), Z-Wave (from Sigma Designs, Inc. of Fremont, Calif.), LoRaWAN (from the Lora Alliance of Beaverton, Oreg.), Thread (from the Thread Group of San Ramon, Calif.), IPv6 over low-power wireless personal area networks or 6LoWPAN (from the Internet Engineering Taskforce of Fremont, Calif.), another type of wireless interface, a cellular-telephone communication protocol (e.g., a 3G/4G/5G communication protocol, such as UMTS, LTE), an IEEE 802.3 standard (which is sometimes referred to as 'Ethernet'), 900 MHz of the ISM band, etc. In the discussion that follows, Ethernet, a cellular-telephone communication protocol, Wi-Fi and/or BLE are used as illustrative examples.

Communication among electronic devices is shown in FIG. 1, which presents a block diagram illustrating an example of a lighting system in an environment 100. The lighting system may include: a control hub 110, one or more lighting devices 112, and/or computer 114 (such as a server or a computer in a cloud-based computer system), which are sometimes collectively referred to as 'components' in the lighting system. During operation, a mobile application or app executing on electronic device 116, e.g., electronic device 116 (such as a computer and/or a portable electronic device, e.g., a cellular telephone) may be used to configure and/or control the lighting system. Moreover, computer 114 may include: a communication engine (CE) 118 (or module), learning engine (LE) 120 (or module), design engine (DE) 122 (or module), and/or lighting engine (LE) 124 (or module). Furthermore, the one or more lighting devices 112 may include a variety of types of lights, such as: standard incandescent light bulbs, light emitting diodes (LEDs), non-standard lights, e.g., down lights, strip lights, string lights, etc.

Note that components in the lighting system may communicate with each other via a network 126 (such as the Internet), an optional cellular-telephone network 128 (e.g., via an optional base station 130) and/or a wireless local area network or WLAN (e.g., via an optional access point 132, such as a physical access point or a virtual access point that is implemented using software). Thus, the communication may involve wired and/or wireless communication. In embodiments where the communication involves wireless communication, the wireless communication includes: transmitting advertising frames on wireless channels, detecting another component in the lighting system by scanning wireless channels, establishing connections (for example, by transmitting association requests), and/or transmitting and receiving packets.

Figure 11:
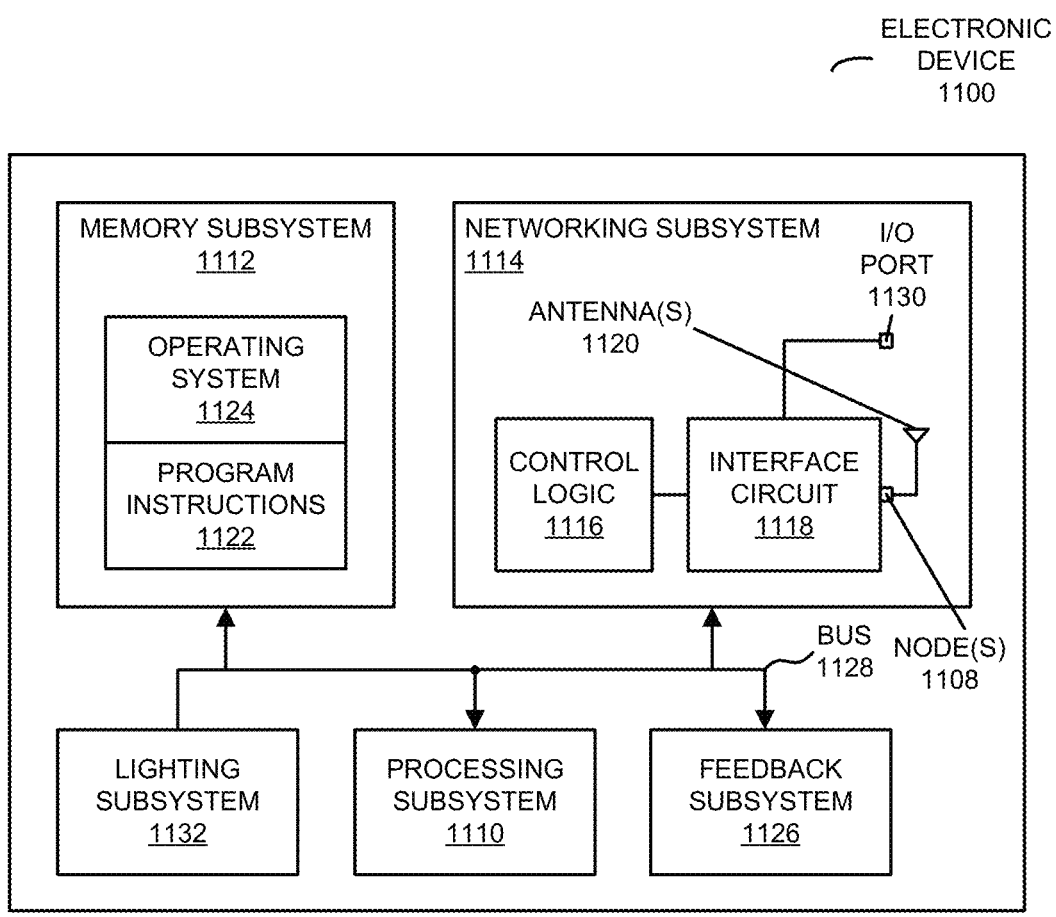
FIG. 11 is a block diagram illustrating an electronic device in accordance with an embodiment of the present disclosure.

As described further below with reference to FIG. 11, control hub 110, lighting devices 112, computer 114, electronic device 116, optional base station 130 and/or optional access point 132 may include subsystems, such as a networking subsystem, a memory subsystem and a processor subsystem. In addition, control hub 110, lighting devices 112, electronic device 116, optional base station 130 and/or optional access point 132 may include radios 134 in the networking subsystems. More generally, the components can include (or can be included within) any electronic devices with the networking subsystems that enable these components to communicate with each other. Note that wireless communication can comprise transmitting advertisements on wireless channels to enable a pair of components to make initial contact or detect each other, followed by exchanging subsequent data/management frames (such as association requests and responses) to establish a connection, configure security options (e.g., Internet Protocol Security), transmit and receive packets or frames via the connection, etc.

Moreover, as can be seen in FIG. 1, wireless signals 136 (represented by a jagged line) are transmitted by radios 134 in the components. For example, radio 134-1 in electronic device 116 may transmit information (such as packets) using wireless signals. These wireless signals may be received by radios 134 in one or more of the other components, such as by control hub 110, optional base station 130 or optional access point 132. This may allow electronic device 116 to communicate information to control hub 110, computer 114, optional base station 130, and/or optional access point 132.

In the described embodiments, processing a packet or frame in a component may include: receiving the wireless signals with the packet or frame; decoding/extracting the packet or frame from the received wireless signals to acquire the packet or frame; and processing the packet or frame to determine information contained in the packet or frame.

Note that the communication between at least any two of the components in the lighting system may be characterized by one or more of a variety of performance metrics, such as: a received signal strength indication (RSSI), a data rate, a data rate for successful communication (which is sometimes referred to as a 'throughput'), an error rate (such as a retry or resend rate), a mean-square error of equalized signals relative to an equalization target, intersymbol interference, multipath interference, a signal-to-noise ratio, a width of an eye pattern, a ratio of number of bytes successfully communicated during a time interval (such as 1-10 s) to an estimated maximum number of bytes that can be communicated in the time interval (the latter of which is sometimes referred to as the 'capacity' of a communication channel or link), and/or a ratio of an actual data rate to an estimated data rate (which is sometimes referred to as 'utilization').

Control hub 110 and/or the one or more lighting devices 112 may include one or more sensors (such as an imaging sensor or a camera, a microphone, etc.) that perform measurements of sensor data in environment 100, such as acquiring or measuring: an image, video, sound, speech, brightness, light color, locations of one or more objects in environment 100, etc. The sensor data may be analyzed, e.g., using an image-analysis technique, to determine information, such as: a number of individuals in environment 100, activities of one or more individuals, states of the one or more objects in environment 100 (such as open or closed, on or off, etc.), a type of reaction of an individual (such as to a particular lighting configuration), a mood or emotional state of the individual, a layout of environment 100 (such as a room geometry, which may include the locations of the one or more objects, types of objects, etc.), one or more types of objects in environment 100, a style or style type of environment 100, identify the one or more individuals, a voice or verbal command from speech, etc. Note that a location in environment 100 may be determined using: a local positioning system, a global positioning system, wireless ranging, wireless signals, triangulation and/or trilateration.

In some embodiments, the image-analysis technique may determine features from one or more images. For example, the image-processing technique may determine the features using: a discrete Fourier transform, principal component analysis and/or a JPEG analysis. Moreover, the features may be determined using: an edge or a line-segment detector, a texture-based feature detector, a texture-less feature detector, a scale invariant feature transform (SIFT)-like object-detector, a speed-up robust-features (SURF) detector, a binary-descriptor (such as ORB) detector, a binary robust invariant scalable keypoints (BRISK) detector, a fast retinal keypoint (FREAK) detector, a binary robust independent elementary features (BRIEF) detector, a features from accelerated segment test (FAST) detector, a motion detector (such as a Gaussian-mixture model), etc. More generally, the features may be determined using a feature extraction technique.

Furthermore, the image-analysis technique may include or may use a pretrained neural network (such as a convolutional neural network) or a machine-learning model, where the image-processing technique uses one or more images and/or features in the one or more images, and provides an output (such as a type of reaction, a context, etc.). For example, an output may be determined using a classifier or a regression model that was trained using a supervised learning technique (such as a support vector machine, a classification and regression tree, logistic regression, LASSO, linear regression and/or another linear or nonlinear supervised-learning technique). Alternatively or additionally, the image-analysis analysis may use an unsupervised learning technique, such as a clustering technique.

Note that the lighting system may be able to leverage additional information provided, directly or indirectly, from electronic device 116. For example, electronic device 116 may provide: a timestamp, occurrence of events based at least in part on a user's schedule or calendar, messages associated with a user, e.g., text messages or emails, social media posts, weather conditions, acceleration measurements (which may indicate motion of the individual), etc.

Moreover, the information and/or the additional information may be used as inputs to a predictive model (such as a pretrained supervised-learning model, e.g., a machine-learning model or a neural network), which may provide an output (such as a context of environment 100). As described further below, the context may be used to facilitate automatic design of a lighting configuration (such as a number of lights or lighting devices, types of lights or lighting devices, locations of the lights or lighting devices in environment 100, lighting patterns of the lights or lighting devices, and/or lighting directions of the lights or lighting devices) and/or dynamic lighting states of the one or more lighting devices 112 (such as intensities and/or colors of the lights in the one or more lighting devices 112). More generally, the information and/or the additional information may be used to control the one or more lighting devices 112, such as: which of the one or more lighting devices 112 are turned on or off, setting the brightness or intensity of the one or more lighting devices 112, setting the color (in a color space, e.g., RGB) or color temperature of the one or more lighting devices 112, creating temporal and/or spatial patterns of light, etc.

In general, different embodiments may implement the functionality and control of the functionality in control hub 110 and/or the one or more lighting devices 112 in hardware and/or software, as is known to one of skill in the art. This software may support the ability to set the functions of the one or more lighting devices 112 on an individual lighting-device basis, as well as in user-defined groups in the one or more lighting devices 112 or universally. Users can also create schedules, rules, scenes, lighting configurations, lighting states and/or light shows (some or all of which are sometimes referred to as a 'lighting preference'), which dynamically adjust these settings.

For example, in some embodiments, the lighting techniques may be implemented using program instructions or software that is executed in an environment on control hub 110, computer 114 and/or electronic device 116, such as: an application executed in the operating system of control hub 110, computer 114 and/or electronic device 116, as a plugin for a Web browser, or an application tool that is embedded in a web page and that executes in a virtual environment of the Web browser (e.g., in a client-server architecture). Note that the software may be a standalone application or a portion of another application that is resident on and that executes on control hub 110, computer 114 and/or electronic device 116 (such as a software application that is provided by control hub 110, computer 114 and/or electronic device 116, or that is installed on and that executes on control hub 110, computer 114 and/or electronic device 116).

Alternatively or additionally, in some embodiments, software executing in an environment on control hub 110 and/or electronic device 116 may interact, via network 126 with computer 114. Then, as described further below, computer 114 may perform at least some of the operations in embodiments of the lighting techniques, and may provide a light preference of an individual, information specifying a lighting configuration of one or more lights and/or information specifying lighting states of the one or more lights to control hub 110 and/or electronic device 116. Thus, the lighting techniques may be implemented locally and/or remotely in lighting system. In the discussion that follows, a remote and centralized implementation on computer 114 is used as an illustrative example of the lighting techniques.

As described previously, many existing lighting platforms or systems have limited functionality with user-interfaces that are cumbersome, confusing and/or time-consuming to use. These problems often degrade the user experience, increase user frustration and limit adoption of smart lighting and associated systems.

In order to address the problems, in some embodiments the lighting techniques may dynamically learn a lighting preference of an individual. For example, as described further below with reference to FIGS. 2-4, lighting engine 124 in computer 114 may instruction communication engine 120 in computer 114 to provide, based at least in part on an initial lighting preference of an individual, instructions specifying initial lighting states of one or more lighting devices 112 in a lighting configuration in environment 100 to control hub 110, where the lighting configuration may include one or more lights (or types of lights, such as the one or more lighting devices 112) at predefined or predetermined locations in environment 100, and an initial lighting state of a given light may include an intensity and a color of the given light. Then, control hub 110 may provide the instructions to the one or more lighting devices 112, which may provide light according to initial lighting states.

Moreover, control hub 110 and/or the one or more lighting devices 112 may perform one or more measurements to obtain sensor data, which is then provided to communication engine 118 in computer 114. This sensor data may specify a non-verbal physical response of the individual to initial lighting states of the one or more lighting devices 112. Next, learning engine 120 in computer 114 may determine, based at least in part on the non-verbal physical response, a type of reaction of the individual to the initial lighting state, such as a negative reaction.

Furthermore, learning engine 120 in computer 114 may selectively modify, based at least in part on a lighting behavior history of the individual and/or the determined type of reaction, the initial lighting preference of the individual to obtain an updated lighting preference. In some embodiments, lighting engine 124 in computer 114 may provide, based at least in part on the updated lighting preference, second instructions specifying second lighting states of the one or more lighting devices 112 in lighting configuration in environment 100 to control hub 110, where the second lighting states are different from the initial lighting states.

Additionally, control hub 110 may provide the second instructions to the one or more lighting devices 112, which may provide light according to the second lighting states.

In these ways, the lighting techniques may allow the lighting system to dynamically learn and adapt to the individual's lighting preference(s) without requiring additional action by the individual. Notably, the lighting techniques may provide closed-loop adaptation based at least in part on implicit or non-verbal feedback from the individual. Thus, over time, the lighting techniques may allow the lighting system to correctly anticipate the light preference and, therefore, the lighting states of the one or more lighting devices 112. For example, over time, the accuracy the lighting preference and the lighting states may be improved to better than 80, 90, 95 or 99%.

Moreover, in some embodiments the lighting techniques may determine a dynamic lighting configuration of one or more lights. For example, as described further below with reference to FIGS. 5-7, a mobile application and/or a desktop application on electronic device 116 may be used to dynamically create or generate a lighting design (such as settings, a lighting configuration that includes the one or more lighting devices 112, lighting states of the one or more lighting devices 112, etc.).

Notably, a user or an individual may upload one or more photographs or images of environment 100 (such as one or more different views or perspectives of a room) from electronic device 116 to communication engine 118 in computer 114. Then, design engine 122 in computer 112 may use at least an image-processing technique to analyze the one or more images to generate a digital representation of environment 100, such as 3D digital representation or a layout of environment 100.

Moreover, design engine 122 in computer 114 may generate and communication engine 118 may provide a rendering of the 3D digital representation of environment 100 to electronic device 116. Electronic device 116 may display the rendering of the 3D digital representation in a user interface on a display.

Next, the individual may interact with the user interface (such as by making selections in the user interface) to specify an initial lighting configuration (including a number of the one or more lighting devices 112, locations of the one or more lighting devices 112 and/or lighting states of the one or more lighting devices 112). For example, the individual may interact with the user interface on electronic device 116 to specify the selections of one or more lighting devices 112, locations of the one or more lighting devices 112 and/or one or more predefined lighting configurations (with different number of lighting devices 112, types of lighting devices 112, locations of lighting devices 112, etc.), such as by using a keyboard or a mouse to make selections, using voice-recognition to make selections, and/or by uploading a file. In these ways, the individual may specify an initial lighting design. Electronic device 116 may provide information specifying the initial lighting configuration to communication engine 118 in computer 114. In some embodiments, the one or more predefined lighting configurations may be associated with one or more third parties, such as via a lighting design marketplace.

Furthermore, design engine 122 in computer 114 may generate, based at least in part on an initial lighting configuration in environment 100 and a layout (or a 3D digital representation) of environment 100, a simulation of environment 100 with the initial lighting configuration. Then, communication engine 118 in computer 114 may provide the simulation to electronic device 116. Electronic device 116 may display the simulation, e.g., in the user interface on a display or in a headset (such as by using augmented or virtual reality).

Instead of having the individual dynamically iterate or modify the initial lighting design to explore different design options, the lighting techniques may automatically determine and present one or more modifications to the initial lighting design. Notably, design engine 122 in computer 114 may analyze the one or more images using an image-analysis technique to determine a context associated with environment 100. Then, based at least in part on the initial lighting configuration, the layout of environment 100, and the determined context, design engine 122 in computer 114 may modify the initial lighting configuration to obtain an updated lighting configuration. For example, the updated lighting design may add (or remove) one or more of the one or more lighting devices 112, may change types of lighting devices, may change locations of at least some of the one or more lighting devices 112, may change lighting states of the one or more lighting devices 112, etc. Alternatively or additionally, the updated lighting configuration may select a different predefined lighting configuration.

In some embodiments, the updated lighting configuration may be determined based at least in part on one or more predefined lighting design principles, such as: providing brightest light on a chair where an individual may read material (e.g., a book) and reduced light intensity (such as a 30% reduced light intensity) in a remainder of the environment; and/or not directing light at a display (such as a television) or furniture (such as a couch) where one or more viewers may sit, while having soft (i.e., low intensity) orange or white-colored light in a remainder of the environment. Thus, updated lighting configuration may adapt the individual's initial lighting configuration to appropriately match the context of environment 100 in order to try to achieve (or approximate) one or more predefined lighting design principles.

Additionally, based at least in part on the updated lighting configuration and the layout, design engine 122 in computer 114 may generate an updated simulation of environment 100 with the updated lighting configuration. Then, communication engine 118 in computer 114 may selectively provide a rendering of the updated simulation. For example, if the individual selects the updated lighting configuration in the user interface (such as by activating a physical button or a virtual icon), communication engine 118 may provide the updated simulation of environment 100 with the updated lighting configuration to electronic device 116. Electronic device 116 may display the updated simulation, e.g., in the user interface on the display or in the headset (such as by using augmented or virtual reality).

Once the lighting configuration is finalized, the individual may indicate this, via the user interface to electronic device 116. In some embodiments, the user may purchase or rent (e.g., one-time or on an ongoing/renewable basis) the lighting configuration. In response, electronic device 116 may provide the lighting configuration to computer 114 and to control hub 110. Subsequently (such as in response to a user command, a schedule, etc.), control hub 110 may use the lighting configuration to provide a designed illumination in environment 100 using at least a subset of the one or more lighting devices 112. For example, based at least in part on the lighting configuration, control hub 110 may instruct lighting devices 112 to provide a specified spatial and/or temporal lighting pattern (and, more generally, lighting states) in environment 100.

In these ways, the lighting techniques may assist the individual in obtaining a lighting configuration that is appropriate for the condition or circumstances (e.g., based at least in part on the determined context). Moreover, automatically updating the lighting configuration, the lighting techniques may reduce the effort and the time needed to obtain the lighting configuration. Consequently, the lighting techniques may provide an improved service, and may enhance the user experience when using the lighting system.

Furthermore, in some embodiments the lighting techniques may determine dynamic lighting states of one or more lights. For example, as described further below with reference to FIGS. 8-10, lighting engine 124 in computer 114 may obtain information specifying a lighting configuration of one or more lighting devices 112 in environment 100, where the lighting configuration may include one or more lights (or types of lights) in the one or more lighting devices 112 at predefined or predetermined locations in environment 100.

Then, control hub 110 and/or the one or more lighting devices 112 may acquire or measure sensor data associated with environment 100 (such as one or more images, sound, etc.), which is provided to communication engine 118 in computer 114. Moreover, lighting engine 124 in computer 114 may analyze the sensor data to determine a context associated with environment 100.

Furthermore, based at least in part on the lighting configuration, a layout of environment 100, and the determined context, lighting engine 124 in computer 114 may automatically determine the dynamic lighting states of the one or more lights in the one or more lighting devices 112, where a dynamic lighting state of a given light includes an intensity and a color of the given light. Next, communication engine 118 in computer 114 may provide instructions corresponding to the dynamic lighting states to control hub 110. Additionally, control hub 110 may provide the instructions to the one or more lighting devices 112, which may provide light according to the determined dynamic lighting states.

In these ways, the lighting techniques may assist the individual in obtaining lighting states of the one or more lights in the one or more lighting devices 112 that are appropriate for the condition or circumstances (e.g., based at least in part on the determined context). Moreover, automatically determining the lighting states, the lighting techniques may reduce the effort and the time needed to obtain the lighting states. Consequently, the lighting techniques may provide an improved service, and may enhance the user experience when using the lighting system.

Although we describe the communication environment shown in FIG. 1 as an example, in alternative embodiments, different numbers or types of electronic devices may be present. For example, some embodiments comprise more or fewer components. As another example, in another embodiment, different components are transmitting and/or receiving packets or frames.

Figure 2:
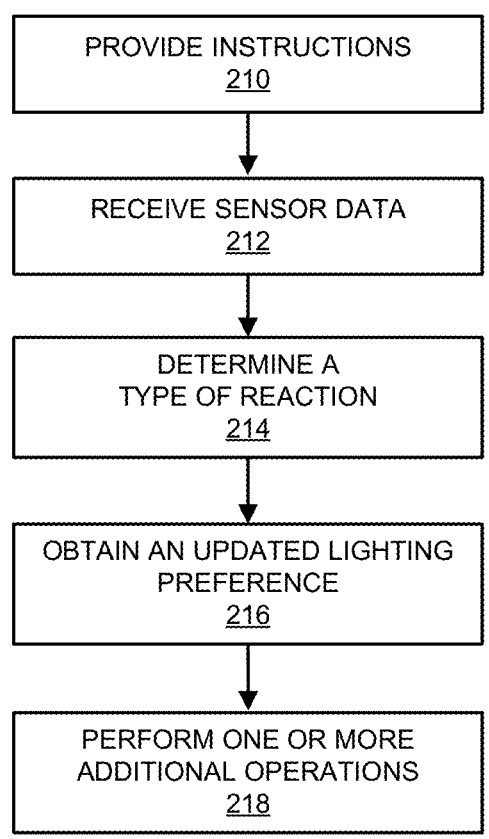
FIG. 2 is a flow diagram illustrating an example method for dynamically learning a lighting preference of an individual in accordance with an embodiment of the present disclosure.

FIG. 2 presents embodiments of a flow diagram illustrating method 200 for dynamically learning a lighting preference of an individual, which may be performed by a computer (such as control hub 110 or computer 114 in FIG. 1). Notably, the computer may include a computation device that performs method 200. For example, the computation device may include one or more of: a processor, one or more cores in a second processor, or another type of device that performs computation (such as one or more GPUs, which may implement a neural network).

During operation, the computer may provide, based at least in part on an initial lighting preference of the individual, instructions (operation 210) specifying initial lighting states of one or more lights in a lighting configuration in an environment to the one or more lights in the environment, where the lighting configuration includes the one or more lights (or types of lights) at predefined or predetermined locations in the environment, and the initial lighting state of a given light includes an intensity and/or a color of the given light. For example, the initial lighting preferences may specify the lighting states and/or the lighting configuration.

Then, the computer may receive sensor data (operation 212) specifying a non-verbal physical response of the individual to initial lighting states of the one or more lights. In some embodiments, the sensor data may include an image or a video of at least a portion of the individual. Alternatively or additionally, the sensor data may include sound.

Note that the non-verbal physical response may include a facial expression, a gesture, posture, gait, motion, a gaze or viewing direction, a viewing distance relative to printed material or a display, an eyebrow position, a pupil response, motion of the individual towards or away from one of the one or more lights, and/or another type of non-verbal physical response of the individual. Alternatively or additionally, the non-verbal physical response may include a type of sound other than a verbal or natural-language command associated with or provided by the individual.

Moreover, the computer may determine, based at least in part on the non-verbal physical response, a type of reaction (operation 214) of the individual to the initial lighting state. In some embodiments, the determining of the non-verbal physical response (operation 214) may involve analyzing an image or a video using an image-processing technique. For example, the analysis of the image or the video may provide one or more features that are used as inputs to a pretrained machine-learning model or a neural network, which provides or outputs information specifying the type of reaction (such as a numerical value or score).

Next, based at least in part on a lighting behavior history of the individual and the determined type of reaction, the computer may selectively modify the initial lighting preference of the individual to obtain an updated lighting preference (operation 216), such as a lighting configuration and/or one or more lighting states of one or more lights for a current circumstance or context in the environment. For example, the computer may modify the initial lighting preference when the type of reaction is negative. Notably, when a numerical value or score associated with the type of reaction is, e.g., less than a threshold value (such as '0' or '0.5'), the computer may modify the initial lighting preference. Moreover, the lighting behavior history may include prior instances of verbal or natural-language commands corresponding to prior lighting states of one or more lighting configurations associated with the individual and/or feedback about the prior lighting states of the one or more lighting configurations associated with the individual. Notably, the feedback may include changes to the prior lighting states of the one or more lighting configurations. The lighting behavior history may predict or guide the lighting preference of the individual in the current circumstance or context (as indicated by the type of reaction) based at least in part on previous selections or commands, and/or changes to the previous selections or commands, provided by the individual.

In some embodiments, the computer optionally performs one or more additional operations (operation 218). For example, the computer may provide, based at least in part on the updated lighting preference, second instructions specifying second lighting states of the one or more lights in the lighting configuration in the environment to the one or more lights, where the second lighting states are different from the initial lighting states.

Note that the instructions or the second instructions may be provided via a control hub. Alternatively, the computer may be the control hub.

Moreover, the determining of the type of reaction (operation 214) and the modifying of the initial lighting preference (operation 216) may involve or may use a GAN.

Furthermore, the receiving of the sensor data (operation 212) may involve the computer measuring the sensor data, such as by acquiring the image, the video, and/or the sound.

In this way, the computer (for example, software executed in an environment, such as an operating system, on the computer) may conduct an experiment in which the instructions for the initial lighting states of the one or more lights in the lighting configuration are provided and the non-verbal physical response of the individual is measured. This information, as well as past lighting behaviors of the individual (or one or more similar individuals, such as individuals having one or more attributes or characteristics in common with the individual, e.g., similar or the same social demographic information, income, age, tastes, type of residence, location, etc.), may allow the lighting preference to be automatically updated when the type of reaction indicates that the individual was displeased with the initial lighting states. Consequently, the lighting techniques may dynamically learn the lighting states that is appropriate or preferred by the individual for a particular environment (including the conditions, circumstances or context of or in the environment). Thus, the lighting techniques may simplify use of the lighting system, and may enhance the user experience and satisfaction of the users of the lighting system.

In some embodiments of method 200, there may be additional or fewer operations. Furthermore, there may be different operations. Moreover, the order of the operations may be changed, and/or two or more operations may be combined into a single operation.

Figure 3:
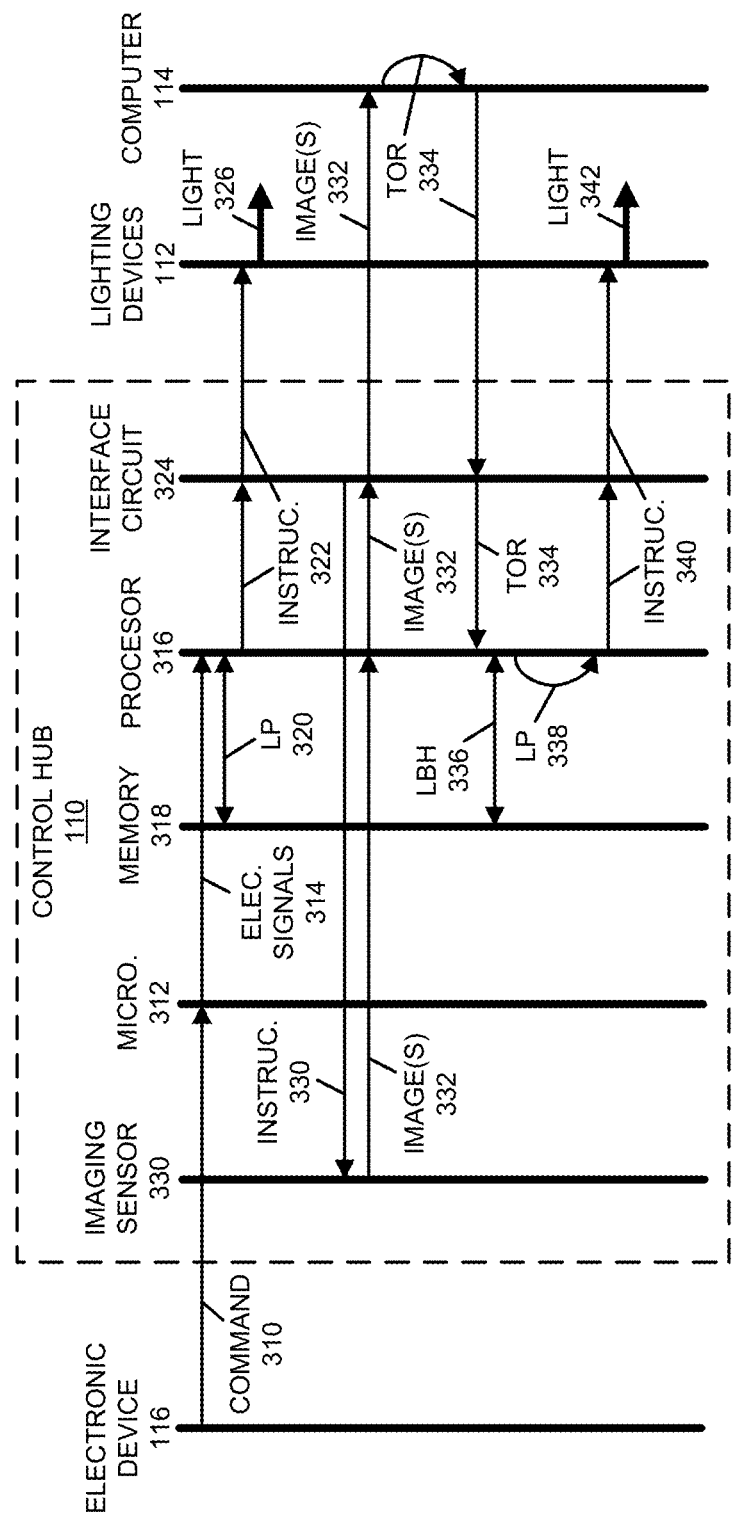
FIG. 3 is a drawing illustrating an example of communication among components in the lighting system in FIG. 1 in accordance with an embodiment of the present disclosure.

Embodiments of the lighting techniques are further illustrated in FIG. 3, which presents a drawing illustrating communication among control hub 110, the one or more lighting devices 112, computer 114 and electronic device 116. Notably, during the lighting techniques, electronic device 116 may provide a command 310 to control hub 110 based at least in part on a user selection or request for lighting. For example, an individual may provide a voice command to 'turn on lights.'

Microphone 312 in control hub 110 may receive sound corresponding to command 310 and may provide electrical signals 314 corresponding to the sound to processor 316 in control hub 310. In response to electrical signals 314, processor 316 may access, in memory 318 in control hub 110, a lighting preference (LP) 320, and may provide, based at least in part on lighting preference 320, instructions 322 specifying initial lighting states of the one or more lighting devices 112 in a lighting configuration in an environment to interface circuit 324 in control hub 110. Then, interface circuit 324 may provide instructions 322 to the one or more lighting devices 112, which may output light 326 based at least in part on instructions 322. Note that light 326 may correspond to the initial lighting states.

Moreover, processor 316 may instruct 328 imaging sensor 330 (such as a CMOS or a CCD sensor) in control hub 110 to acquire one or more images 332 of the individual. The one or more images 332 may specifying a non-verbal physical response of the individual to the initial lighting states of the one or more lighting devices 112.

Next, processor 316 may provide the one or more images 332 to interface circuit 324, which provides the one or more images 332 to computer 114. After receiving the one or more images 332, computer 114 may determine a type of reaction (TOR) 334 of the individual to the initial lighting state based at least in part on the non-verbal physical response specified by the one or more images 332 (such as based at least in part on one or more features in the one or more images 332). For example, computer 114 may analyze the one or more images 332 to determine one or more features that are used as inputs to a pretrained machine-learning model or a neural network, which provides or outputs information specifying the type of reaction 334.

Furthermore, computer 114 may provide information specifying the type of reaction 334 to control hub 110. After receiving the information specifying the type of reaction 334, interface circuit 324 may provide the information to processor 316. In response, processor 316 may access a lighting behavior history (LBH) 336 of the individual in memory 318. Then, based at least in part on the type of reaction 334 and lighting behavior history 336, processor 316 may modify lighting preference 320 to obtain updated lighting preference 338.

Additionally, processor 316 may provide, based at least in part on lighting preference 338, instructions 340 specifying updated lighting states of the one or more lighting devices 112 in the lighting configuration in the environment to interface circuit 324. Then, interface circuit 324 may provide instructions 340 to the one or more lighting devices 112, which may output light 342 based at least in part on instructions 340. Note that light 342 may correspond to the updated lighting states, which may be different from the initial lighting states (and, thus, from light 326).

While FIG. 3 illustrates unilateral communication between components, in some embodiments one or more of these communication operations involve bilateral communication.

Figure 4:
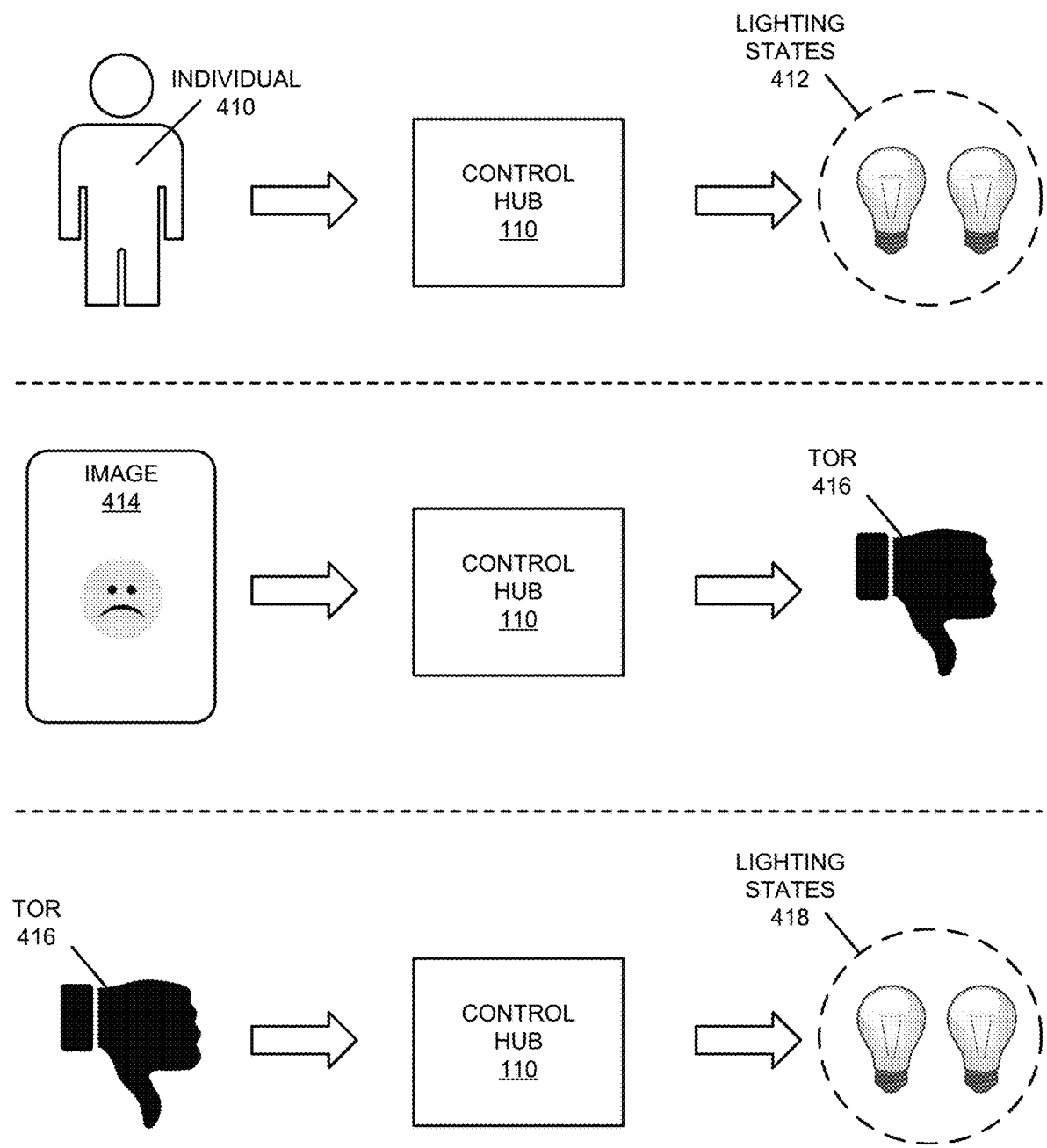
FIG. 4 is a flow diagram illustrating an example of dynamically learning a lighting preference of an individual in accordance with an embodiment of the present disclosure.

FIG. 4 presents a flow diagram illustrating an example of dynamically learning a lighting preference of an individual. Notably, based at least in part on an initial lighting preference of the individual 410, control hub 110 may instruct lighting devices 112 to have initial lighting states 412. Then, control hub 110 may measure sensor data, such as one or more images 414, of the individual that specify a non-verbal physical response of individual 410. This sensor data may be analyzed to determine a type of reaction 416 of individual 410. Next, based at least in part on a lighting behavior history of individual 410 and the determined type of reaction 416, control hub 110 may modify the initial lighting preference of individual 410 to obtain an updated lighting preference. Furthermore, based at least in part on the updated lighting preference of the individual 410, control hub 110 may instruct lighting devices 112 to have updated lighting states 418.

Figure 5:
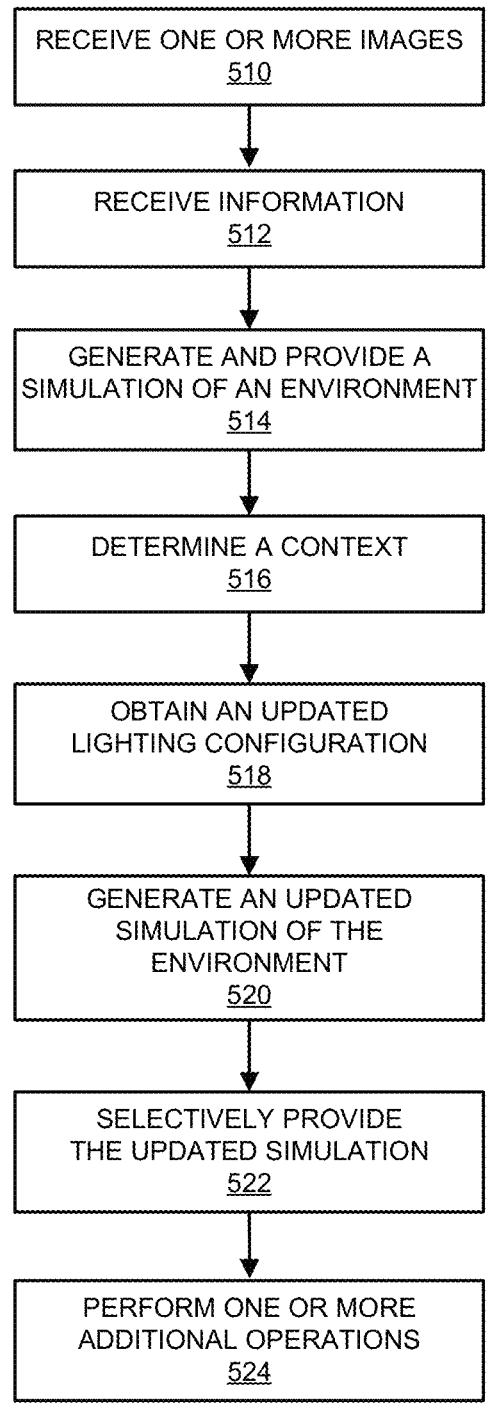
FIG. 5 is a flow diagram illustrating an example method for automatically changing a lighting configuration in accordance with an embodiment of the present disclosure.

FIG. 5 presents a flow diagram illustrating an example method 500 for automatically changing a lighting configuration, which may be performed by a computer (such as control hub 110 or computer 114 in FIG. 1). Notably, the computer may include a computation device that performs method 200. For example, the computation device may include one or more of: a processor, one or more cores in a second processor, or another type of device that performs computation (such as one or more GPUs, which may implement a neural network).

During operation, the computer may receive one or more images (operation 510) of an environment. For example, the receiving of the one or more images (operation 510) may involve the computer acquiring or measuring the one or more images.

Then, the computer may receive information (operation 512) specifying an initial lighting configuration in the environment, where the initial lighting configuration includes one or more lights (or types of lights) at predefined or predetermined locations in the environment, dynamic lighting states of the one or more lights, and a dynamic lighting state of the given light includes an intensity and a color of the given light. For example, the information specifying the initial lighting configuration may include user-interface activity associated with a user interface, e.g., which may be received from an individual that interacted with the user interface. Thus, the information specifying the initial lighting configuration in the environment may be selected by the individual using the user interface.

Based at least in part on the initial lighting configuration and a layout of the environment specified by the one or more images, the computer may generate and provide a simulation of the environment (operation 514) with the initial lighting configuration.

Moreover, the computer may analyze the one or more images using an image-analysis technique to determine a context (operation 516) associated with the environment. Note that the context may include: a timestamp (such as a time of day, a day of the week, a month, etc.), a natural lighting condition in the environment (such as a natural light intensity), a location and state of a configurable object in the environment (such as a shade, a curtain or a display), a location of a display in the environment, a type of object in the environment, a style associated with the environment, and/or additional information that describes a current condition or circumstance in or of the environment. More generally, the context may specify a current condition or circumstance in the environment.

Then, based at least in part on the initial lighting configuration, the layout of the environment, and the determined context, the computer may modify the initial lighting configuration to obtain an updated lighting configuration (operation 518).

Next, based at least in part on the updated lighting configuration and the layout, the computer may generate an updated simulation of the environment (operation 520) with the updated lighting configuration.

Furthermore, the computer may selectively provide the updated simulation (operation 522). Note that the computer may provide the updated simulation (operation 522) in response to user-interface activity associated with the user interface that specifies selection of the updated lighting configuration. For example, a user may activate a physical button or a virtual icon, and in response the updated simulation may be presented in the user interface, on a display and/or a headset.

In some embodiments, the simulation or the updated simulation may be provided using augmented or virtual reality. For example, the computer may provide information specifying the simulation or the updated simulation, or may render and display the simulation or the updated simulation on a display and/or a headset.

In some embodiments, the computer optionally performs one or more additional operations (operation 524). For example, the computer may analyze the one or more images to determine the layout (such as a geometry and arrangement of objects) using an image-analysis technique. In some embodiments, the layout may include a digital 3D representation of the environment. Moreover, the computer may analyze the one or more images using the same or a different image-analysis technique to identify one or more related environments having one or more attributes or characteristics that are at least approximately the same as (or similar to) the environment. Note that the one or more attributes may include: a type of environment (such as a living room, a bedroom, a hotel room, etc.), a size of the environment, a geometry of the environment, contents in the environment, a style of the environment, etc. The one or more related environments may be associated with one or more additional individuals. Furthermore, the updated lighting configuration may be based at least in part on the one or more related environments.

In some embodiments, the simulation and/or the updated simulation are based at least in part on so-called archetype rooms having predefined characteristics, such as the characteristics of a bedroom, a living room, a kitchen, etc.

In this way, the computer (for example, software executed in an environment, such as an operating system, on the computer) may help the individual design an improved lighting configuration for the environment. Moreover, by adapting the lighting configuration based at least in part on the determined context, the improved lighting configuration may be better suited or appropriate for the environment. For example, the individual may make one or more selections in the user interface, which specify the initial lighting configuration. Then, the computer may automatically (without further action by the individual) determine the context and generate an updated (and, ideally, improved) lighting configuration. Note that the updated lighting configuration may be based at least in part on or may be adapted from the initial lighting configuration of the individual. Furthermore, an updated simulation of the updated lighting configuration may be presented or display to the individual, e.g., when the individual selects the updated lighting configuration (such as by activating a physical button or a virtual icon in the user interface, which may be adjacent or proximate to a thumbnail image of the updated simulation). In some embodiments, the updated lighting configuration may be determined based at least in part on one or more predefined lighting design principles, such as: providing brightest light on a chair where an individual may read material (e.g., a book) and reduced light intensity (such as a 30% reduced light intensity) in a remainder of the environment; and/or not directing light at a display (such as a television) or furniture (such as a couch) where one or more viewers may sit, while having soft (i.e., low intensity) orange or white-colored light in a remainder of the environment. Thus, the lighting techniques may automatically determine an updated lighting configuration that adapts the individual's initial lighting configuration to appropriately match the current condition or circumstances of the environment (as indicated by the determined context) in order to try to achieve (or approximate) one or more predefined lighting design principles. Consequently, the lighting techniques may enhance the user experience and satisfaction of the users of the lighting system.

In some embodiments of method 500, there may be additional or fewer operations. Furthermore, there may be different operations. Moreover, the order of the operations may be changed, and/or two or more operations may be combined into a single operation. For example, the computer may analyze the one or more images to determine the context and may provide recommendations about the lighting configuration (such as a number of lights, one or more types of lights, locations for the one or more lights in the environment, etc.) for use by the individual before or while the individual is selecting the initial lighting configuration. As the individual makes selections that specify a current lighting configuration, the computer may generate and present a simulation of the environment with the current lighting configuration. In addition, the computer may generate and present updated simulations of the environment with an updated lighting configuration. Thus, the simulation and the updated simulation may be concurrently available for viewing or may be presented or displayed concurrently. These capabilities may assist the individual in selecting a final lighting configuration. Consequently, in some embodiments, the operations in method 500 may be reordered to facilitate these capabilities.

Figure 6:
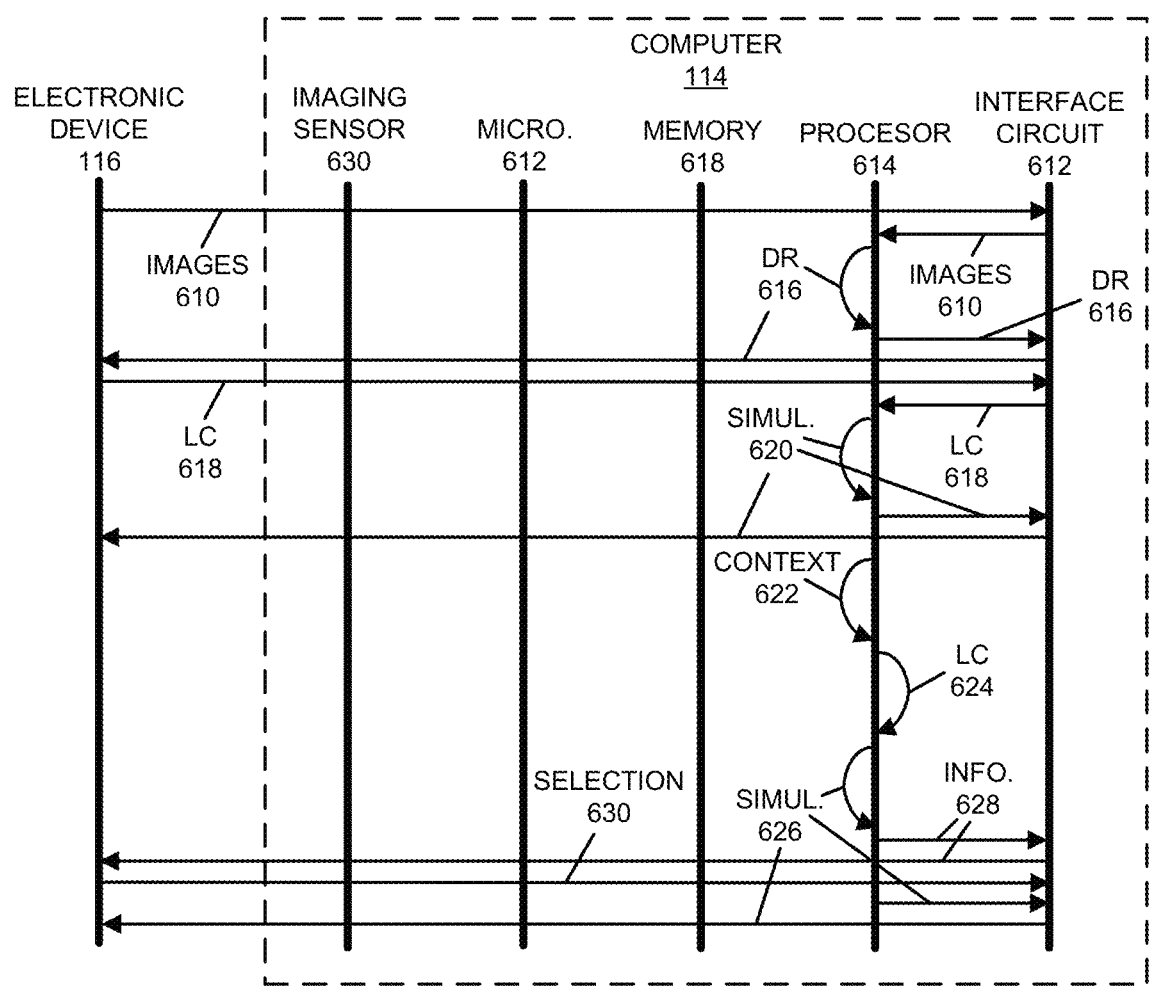
FIG. 6 is a drawing illustrating an example of communication among components in the lighting system in FIG. 1 in accordance with an embodiment of the present disclosure.

Embodiments of the lighting techniques are further illustrated in FIG. 6, which presents a drawing illustrating communication between electronic device 116 and computer 114. Notably, during the lighting techniques, an individual using electronic device 116 may interact with a user interface associated with a lighting design application. Based at least in part on an instruction associated with the user interface, the individual may use an imaging sensor (such as a CMOS or a CCD sensor) in electronic device 116 to acquire one or more images 610 of an environment, which are provided by electronic device 116 to computer 114.

After receiving the one or more images 610, interface circuit 612 in computer 114 may provide the one or more images 610 to processor 614 in computer 114. Processor 614 may analyze the one or more images 610 (e.g., using an image-analysis technique, such as a pretrained neural network) to obtain a 3D digital representation (DR) 616 of the environment. Then, processor 614 may provide information specifying the 3D digital representation 616 to interface circuit 612, which provides the information specifying the 3D digital representation 616 to electronic device 116.

Moreover, after receiving the information specifying the 3D digital representation 616, electronic device 116 may display the 3D digital representation 616 in the user interface (such as on a display in or associated with electronic device 116). Next, the individual may interact with the user interface to specify an initial lighting configuration (LC) 618 in the environment. For example, the individual may activate or select virtual icons corresponding to the one or more lighting devices 112 and may specify locations of the one or more lighting devices 112 in the 3D digital representation 616 (such as by dragging and dropping the one or more lighting devices 112 in the 3D digital representation 616. In addition, the individual may specify dynamic lighting states of the one or more lighting devices 112.

Furthermore, electronic device 116 may provide information specifying the initial lighting configuration 618 to computer 114. After receiving the information specifying the initial lighting configuration 618, interface circuit 612 may provide the information to processor 614. Processor 614 may generate a simulation 620 of the environment with the initial lighting configuration 618. Then, processor 614 may provide information specifying simulation 620 to interface circuit 612, which provides the information specifying simulation 620 to electronic device 116. After receiving the information specifying simulation 620, electronic device 116 may display simulation 620 (e.g., on the display in or associated with electronic device 116).

Additionally, processor 614 may analyze the one or more images 610 (e.g., using the same or a different image-analysis technique, such as a pretrained neural network) to determine context 622. Then, processor 614 may modify the initial lighting configuration 618 to obtain updated lighting configuration 624 based at least in part on the 3D digital representation 616, the initial lighting configuration 618 and context 622. Moreover, processor 614 may generate an updated simulation 626 of the environment with the updated lighting configuration 624 based at least in part on the 3D digital representation 616 and the updated lighting configuration 624.

Furthermore, processor 614 may provide information 628 summarizing the updated simulation 626 to interface circuit 612, which provides the information 628 summarizing the updated simulation 626 to electronic device 116. After receiving information 628, electronic device 116 may display or present an indication that the updated simulation 626 is available in the user interface.

If the individual interacts with the user interface to select 630 the updated simulation 626, electronic device 116 may provide this selection to computer 114. After receiving selection 630, interface circuit 612 may provide it to processor 614. In response, processor 614 may provide information specifying the updated simulation 626 to interface circuit 612, which provides the information specifying the updated simulation 626 to electronic device 116. After receiving the information, electronic device 116 may display or present the updated simulation 626 (e.g., on the display in or associated with electronic device 116).

While FIG. 6 illustrates unilateral communication between components, in some embodiments one or more of these communication operations involve bilateral communication.

Figure 7:
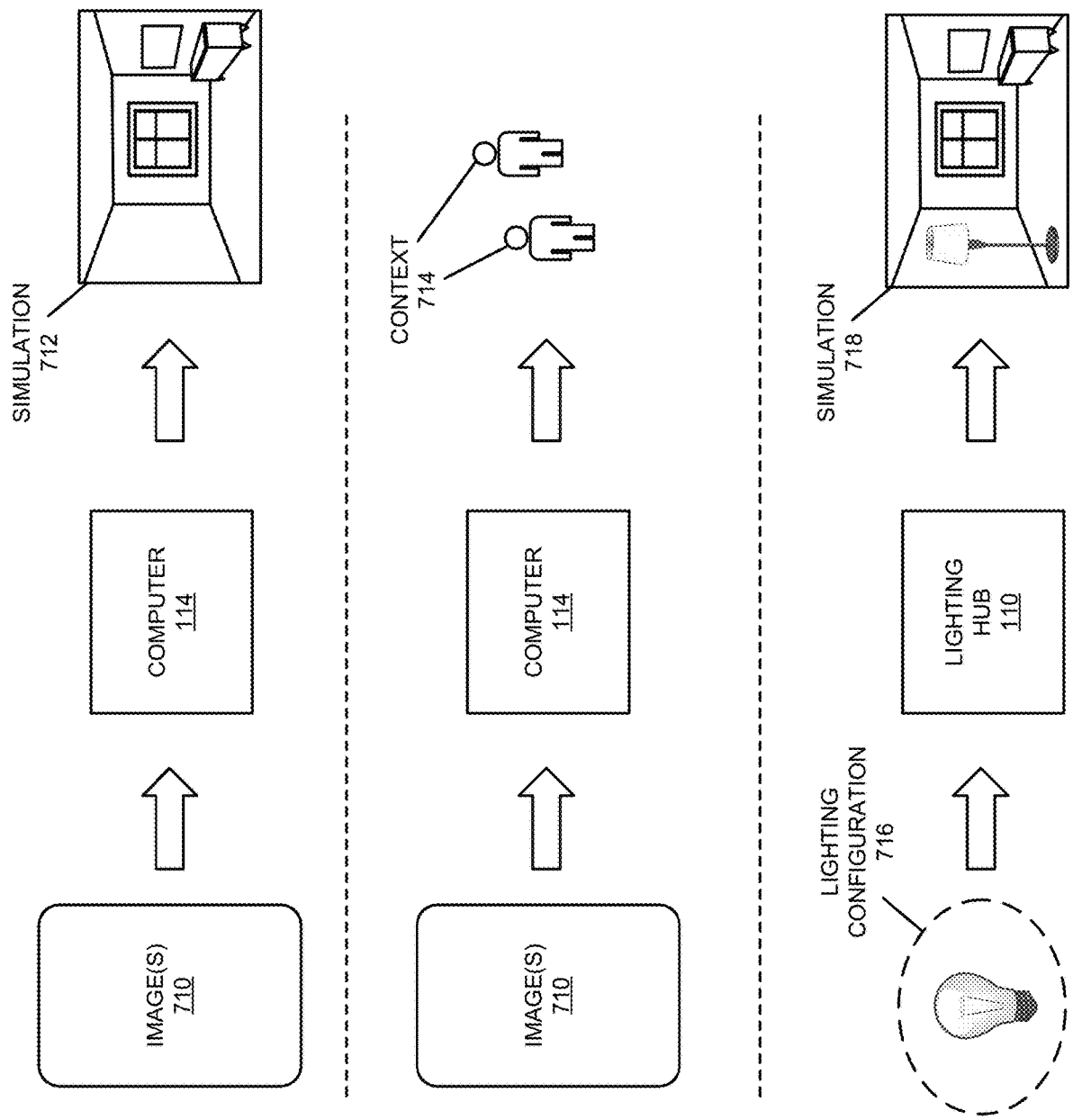
FIG. 7 is a flow diagram illustrating an example of automatically changing a lighting configuration in accordance with an embodiment of the present disclosure.

FIG. 7 presents a flow diagram illustrating an example of automatically changing a lighting configuration. Notably, computer 114 may received one or more images 710 from electronic device 116. Then, based at least in part on an initial lighting configuration and a layout of an environment specified by the one or more images 710, computer 114 may generate and provide a simulation 712 of the environment with the initial lighting configuration. Moreover, computer 114 may analyze the one or more images 710 to determine a context 714. Next, based at least in part on the initial lighting configuration, the layout of the environment, and the determined context 714, computer 114 may modify the initial lighting configuration to obtain an updated lighting configuration 716. Furthermore, based at least in part on the updated lighting configuration 716 and the layout, computer 114 may generate an updated simulation 718 of the environment with the updated lighting configuration 716.

Figure 8:
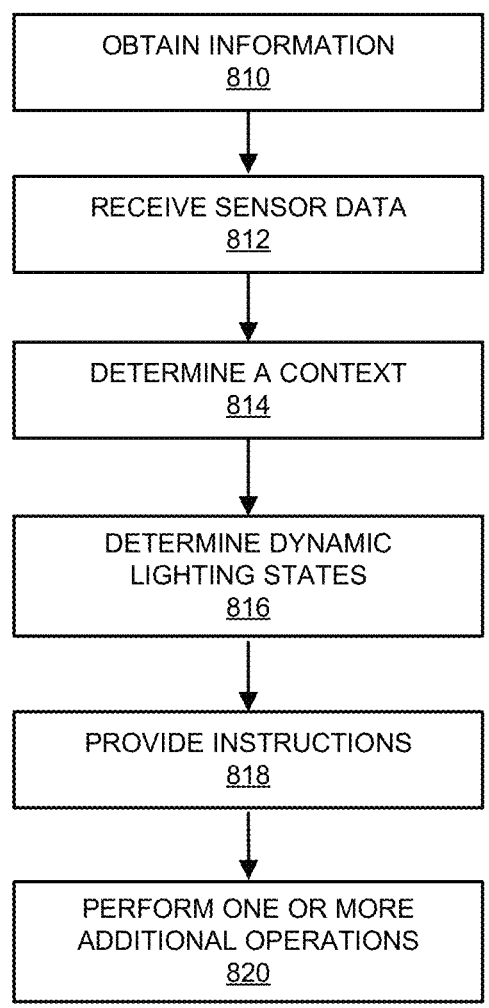
FIG. 8 is a flow diagram illustrating an example method for automatically determining dynamic lighting states in accordance with an embodiment of the present disclosure.

FIG. 8 presents a flow diagram illustrating an example method 800 for automatically determining dynamic lighting states, which may be performed by a computer (such as control hub 110 or computer 114 in FIG. 1). Notably, the computer may include a computation device that performs method 200. For example, the computation device may include one or more of: a processor, one or more cores in a second processor, or another type of device that performs computation (such as one or more GPUs, which may implement a neural network).

During operation, the computer may obtain information (operation 810) specifying a lighting configuration of one or more lights in an environment, where the lighting configuration includes the one or more lights (or types of lights) at predefined or predetermined locations in the environment. For example, obtaining the information (operation 810) specifying the lighting configuration may involve accessing the information in the memory.

Then, the computer may receive sensor data (operation 812) associated with the environment. For example, the receiving of the sensor data (operation 812) may involve the computer acquiring or measuring the sensor data. Note that the sensor data may include one or more images. In some embodiments, the sensor data may include: sound, sensor data associated with a wearable device, temperature measurements from a thermal sensor, a Lidar measurement, a measurement from another connected or Internet-of-things device, etc.

Moreover, the computer may analyze the sensor data to determine a context (operation 814) associated with the environment. For example, the computer may analyze the one or more images using an image-processing technique. Note that the context may include: a timestamp (such as a time of day, a day in a week, a month, etc.), a state of one or more objects in the environment (such as a shade or a curtain, a display, etc.), a number of individuals in the environment, whether an electronic device in the environment is powered on while or whether individuals are present or absent from the environment, locations of one or more individuals in the environment, e.g., relative to one or more second objects in the environment (such as furniture), activities of the one or more individuals (such as reading, sleeping, moving, a predefined type of activity, etc.), start and/or stop times of the activities, a natural lighting condition, etc. In some embodiments, the context includes an identity of an individual. Notably, the individual may be identified using a biometric identification technique, such as facial recognition.

Then, based at least in part on the lighting configuration, a layout of the environment, and the determined context, the computer may automatically determine the dynamic lighting states (operation 816) of the one or more lights, where a dynamic lighting state of a given light includes an intensity and a color of the given light. In some embodiments, the dynamic lighting states may be based at least in part on a lighting preference or a history of lighting configurations associated with the identified individual (which may be included in a lighting behavioral history). Thus, the lighting states may be adjusted on an individual-specific basis (e.g., using the context and/or the lighting behavioral history).

Next, the computer may provide instructions (operation 818) corresponding to the dynamic lighting states to the one or more lights.

In some embodiments, the computer optionally performs one or more additional operations (operation 820). For example, the computer may provide the instructions (operation 818) to the one or more lights via a control hub. Alternatively, the computer may be the control hub.

Moreover, the analysis may identify one or more related environments having attributes that are approximately the same as the environment (and which may be associated with the individual and/or one or more additional individuals), and the dynamic lighting states may be based at least in part on lighting configurations and/or lighting states of the one or more related environments. For example, the computer may analyze the one or more images using the same or a different image-analysis technique to identify one or more related environments having one or more attributes or characteristics that are at least approximately the same as (or similar to) the environment. Note that the one or more attributes may include: a type of environment (such as a living room, a bedroom, a hotel room, etc.), a size of the environment, a geometry of the environment, contents in the environment, a style of the environment, etc.

Furthermore, in some embodiments, based at least in part on the dynamic lighting states, the computer selectively performs a remedial action. For example, the computer may provide a reminder or a notification. Alternatively or additionally, a reminder or notification may be provided based at least in part on a context of one or more activities in an environment (such as a home).

Additionally, the dynamic lighting states may be based at least in part on a transferrable lighting profile with one or more lighting preferences of the individual. For example, the individual may have a transient or finite duration of association with the environment (such as a hotel room), and the transferrable lighting profile of the individual may be associated with one or more second environments that are different from the environment (such as the individual's home). More generally, there may be a transferrable profile, which may encompass settings associated with an activity, which may be in addition to or instead of the one or more lighting preferences. This transferrable profile may be used to setup or configure a wide variety of electronic devices in addition to or instead of one or more lighting devices.

Additionally, the computer may calibrate the one or more lights, where the calibration involves varying the intensity and the color (or color temperature) of the given light using a set of different intensities and colors, and where the calibration assesses an impact of the dynamic lighting states of the one or more lights. For example, during the calibration, the brightness of each lighting device may be varied, e.g., between 0 and 255 in steps of 5 or 10 and, for each brightness value, the color temperature may be varied between candle light (a color-temperature value of a few hundred) and white (a color-temperature value of a few thousand). Moreover, the dynamic lighting states may be determined based at least in part on the calibration and a predefined lighting design principle. For example, the predefined lighting design principle may include: providing brightest light on a chair where an individual may read material (e.g., a book) and reduced light intensity (such as a 30% reduced light intensity) in a remainder of the environment; and/or not directing light at a display (such as a television) or furniture (such as a couch) where one or more viewers may sit, while having soft (i.e., low intensity) orange or white-colored light in a remainder of the environment. Thus, the computer may automatically determine the dynamic lighting states to appropriately match the current condition or circumstances of the environment (as indicated by the determined context) in order to try to achieve (or approximate) one or more predefined lighting design principles.

In this way, the computer (for example, software executed in an environment, such as an operating system, on the computer) may help the individual obtain improved lighting states for the environment. Moreover, by adapting the lighting states based at least in part on the determined context, the improved lighting configuration may be better suited or appropriate for the environment. For example, the computer may automatically (without further action by the individual) determine the context and generate updated (and, ideally, improved) lighting states. Note that the updated lighting states may be based at least in part on or may be adapted from the initial lighting states. In some embodiments, the updated lighting states may be determined based at least in part on prior calibration of the one or more lights (which may assess the impact of the lighting states of the one or more lights on the environment) and/or the predefined lighting design principles. Consequently, the lighting techniques may enhance the user experience and satisfaction of the users of the lighting system.

In some embodiments of method 800, there may be additional or fewer operations. Furthermore, there may be different operations. Moreover, the order of the operations may be changed, and/or two or more operations may be combined into a single operation.

Figure 9:
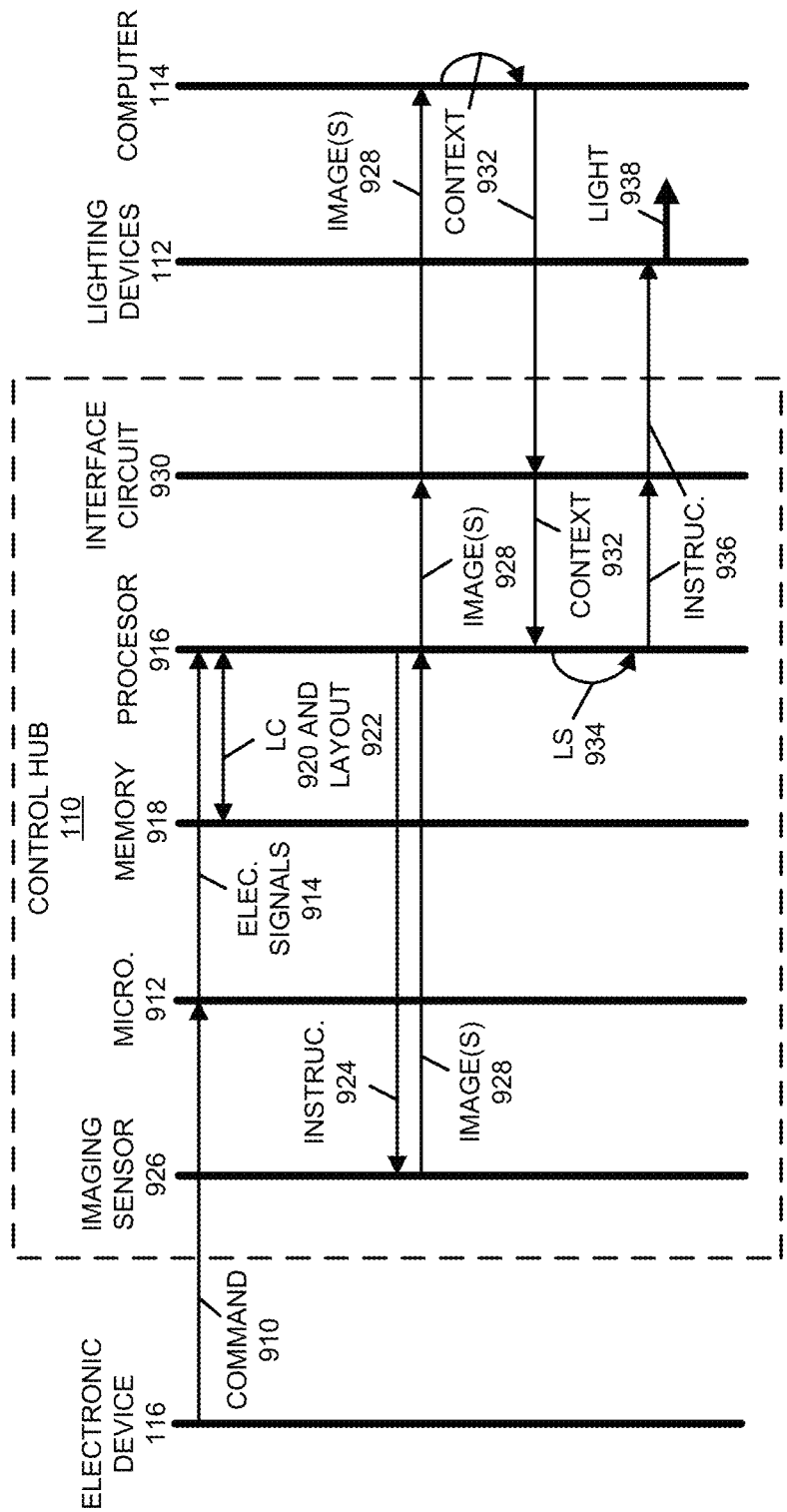
FIG. 9 is a drawing illustrating an example of communication among components in the lighting system in FIG. 1 in accordance with an embodiment of the present disclosure.

Embodiments of the lighting techniques are further illustrated in FIG. 9, which presents a drawing illustrating communication among control hub 110, the one or more lighting devices 112, computer 114 and electronic device 116. Notably, during the lighting techniques, electronic device 116 may provide a command 910 to control hub 110 based at least in part on a user selection or request for lighting. For example, an individual may provide a voice command to 'turn on lights.'

Microphone 912 in control hub 110 may receive sound corresponding to command 910 and may provide electrical signals 914 corresponding to the sound to processor 916 in control hub 910. In response to electrical signals 914, processor 916 may access, in memory 918 in control hub 110, a lighting configuration (LC) 920 and a layout 922 (such as a geometry) of an environment. Moreover, processor 316 may instruct 924 imaging sensor 926 (such as a CMOS or a CCD sensor) in control hub 110 to acquire one or more images 928 of the environment.

Next, processor 916 may provide the one or more images 928 to interface circuit 930 in electronic device 116, which provides the one or more images 928 to computer 114. After receiving the one or more images 928, computer 114 may analyze the one or more images 928 (e.g., using an image-analysis technique, such as a pretrained neural network) to determine a context 932. Then, computer 114 may provide information specifying context 932 to control hub 110.

After receiving the information specifying context 932, interface circuit 930 provides the information to processor 916. Based at least in part on lighting configuration 920, layout 922 and context 932, processor 916 may determine dynamic lighting states (LS) 934 of the one or more lighting devices 112.

Furthermore, processor 916 may provide, based at least in part on the dynamic lighting states 934, instructions 936 specifying the dynamic lighting states 934 to interface circuit 930. In response, interface circuit 930 may provide instructions 936 to the one or more lighting devices 112, which may output light 938 based at least in part on instructions 936. Note that light 938 may correspond to the dynamic lighting states 934.

While FIG. 9 illustrates unilateral communication between components, in some embodiments one or more of these communication operations involve bilateral communication.

Figure 10:
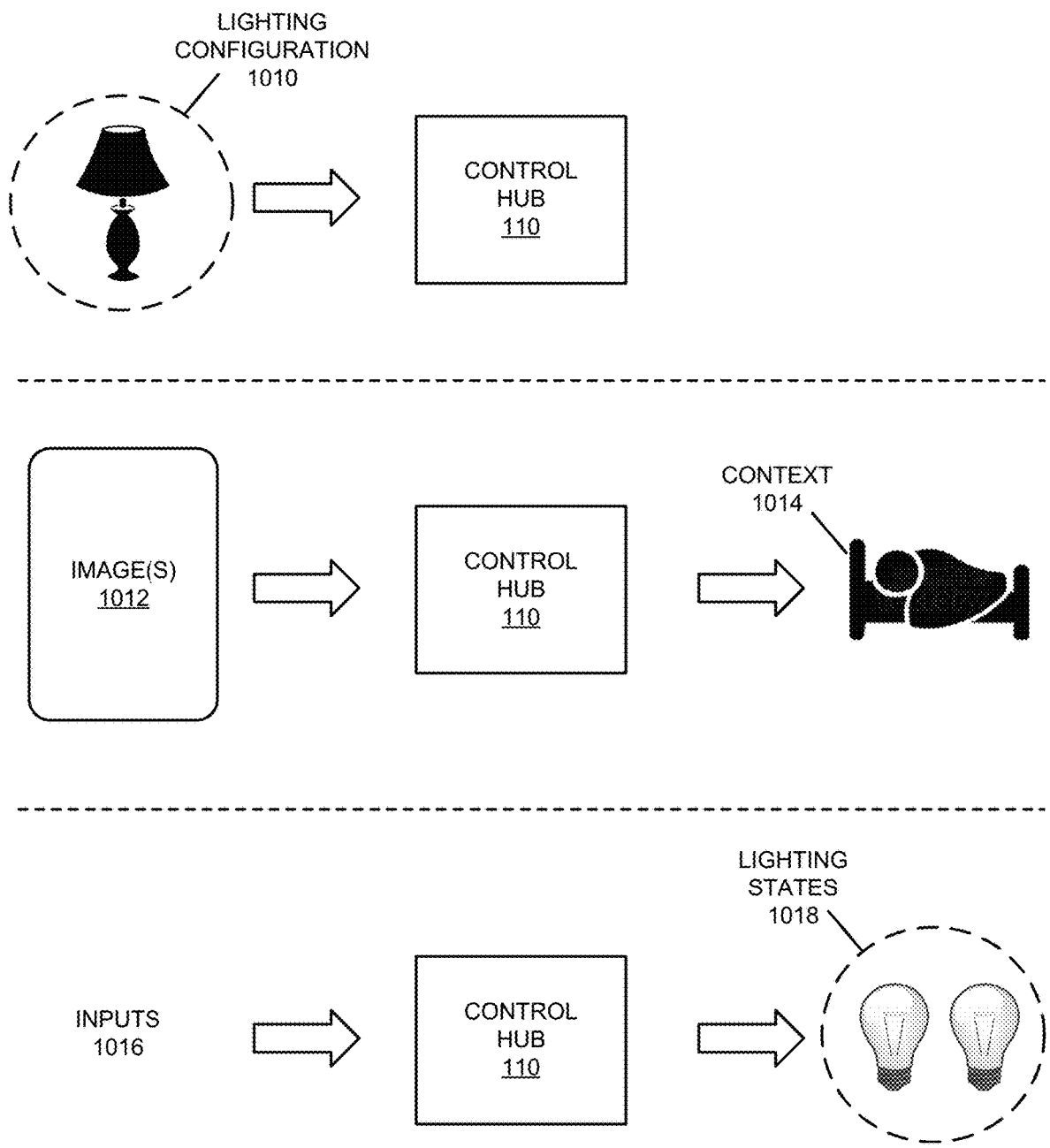
FIG. 10 is a flow diagram illustrating an example of automatically determining dynamic lighting states in accordance with an embodiment of the present disclosure.

FIG. 10 presents a flow diagram illustrating an example of automatically determining dynamic lighting states. Notably, control hub 110 may obtain information specifying a lighting configuration 1010 of one or more lights in an environment. Then, control hub 110 may receive sensor data (such as one or more images 1012) associated with the environment. Moreover, control hub 110 may analyze the one or more images 1012 to determine a context 1014. For example, control hub 110 may determine that a person is sleeping. Next, based at least in part on inputs 1016 (such as lighting configuration 1010, a layout of the environment, and the determined context 1014), control hub 110 may automatically determine dynamic lighting states 1018 of the one or more lights. Furthermore, control hub 110 may provide instructions corresponding to the dynamic lighting states 1018 to one or more lights.

Note that the lighting techniques may use one or more convolutional neural networks. A large convolutional neural network may include, e.g., 60 M parameters and 650,000 neurons. The convolutional neural network may include, e.g., eight learned layers with weights, including, e.g., five convolutional layers and three fully connected layers with a final 1000-way softmax or normalized exponential function that produces a distribution over the 1000 class labels. Some of the convolution layers may be followed by max-pooling layers. In order to make training faster, the convolutional neural network may use non-saturating neurons (such as a local response normalization) and an efficient dual parallelized GPU implementation of the convolution operation. In addition, in order to reduce overfitting in the fully-connected layers, a regularization technique (which is sometimes referred to as 'dropout') may be used. In dropout, the predictions of different models are efficiently combined to reduce test errors. In particular, the output of each hidden neuron is set to zero with a probability of 0.5. The neurons that are 'dropped out' in this way do not contribute to the forward pass and do not participate in backpropagation. Note that the convolutional neural network may maximize the multinomial logistic regression objective, which may be equivalent to maximizing the average across training cases of the log-probability of the correct label under the prediction distribution.

In some embodiments, the kernels of the second, fourth, and fifth convolutional layers are coupled to those kernel maps in the previous layer that reside on the same GPU. The kernels of the third convolutional layer may be coupled to all kernel maps in the second layer. Moreover, the neurons in the fully connected layers may be coupled to all neurons in the previous layer. Furthermore, response-normalization layers may follow the first and second convolutional layers, and max-pooling layers may follow both response-normalization layers as well as the fifth convolutional layer. A nonlinear model of neurons, such as Rectified Linear Units, may be applied to the output of every convolutional and fully-connected layer.

Moreover, in some embodiments, the first convolutional layer filters, e.g., a 224×224×3 input image with 96 kernels of size 11×11×3 with a stride of four pixels (this is the distance between the receptive field centers of neighboring neurons in a kernel map). Note that the second convolutional layer may take as input the (response-normalized and pooled) output of the first convolutional layer and may filter it with, e.g., 256 kernels of size 5×5×48. Furthermore, the third, fourth, and fifth convolutional layers may be coupled to one another without any intervening pooling or normalization layers. The third convolutional layer may have, e.g., 384 kernels of size 3×3×256 coupled to the (normalized, pooled) outputs of the second convolutional layer. Additionally, the fourth convolutional layer may have, e.g., 384 kernels of size 3×3×192, and the fifth convolutional layer may have 256 kernels of size 3×3×192. The fully-connected layers may have, e.g., 4096 neurons each. Note that the numerical values in the preceding and the remaining discussion below are for purposes of illustration only, and different values may be used in other embodiments.

Furthermore, in some embodiments, the convolutional neural network is implemented using at least two GPUs. One GPU may run some of the layer parts while the other runs the remaining layer parts, and the GPUs may communicate at certain layers. The input of the convolutional neural network may be, e.g., 150,528-dimensional, and the number of neurons in the remaining layers in the convolutional neural network may be given by, e.g., 253, 440-186, 624-64, 896-64, 896-43, and 264-4096-4096-1000.

With the rise of trends such as smart homes and quantified self, many people want more and more data about how they live and want to use that data to help them live better.

However, the sensor data from many current sensors is either information about a person or about their environment, but does not provide the context of how the two interact.

Moreover, machine learning has advanced dramatically over the last few years and can even outperform humans in certain tasks, such as recognizing objects in images (which is sometimes referred to as 'computer vision'). There may be an opportunity to use these tools to build a system that not only identifies people and the objects they interact with, but also learns and infers the intent of those interactions, e.g. activities. This capability may be useful for applications, such as Internet-connected systems that currently do not have enough context about people in the environments in which the systems operate (e.g., residential Internet of things).

In some embodiments of the lighting techniques, computer vision and secondary logic are used to recognize how people interact with their environments and the patterns of those interactions. By leveraging an imaging sensor, e.g., a smartphone camera or an Internet-connected camera, images of an environment may be collected. These images may be analyzed using a computer-vision or image-analysis technique to detect, segment, and label objects and people. Then, secondary logic may use the segmented and labeled images to check the status of several distinct contextual factors of the environment, such as: the number of people present, where those people are in relation to objects, who they are, and/or, if the television is on or off, if there is one in the environment. These factors may be combined to determine activities in the environment, which in turn can trigger external connected systems and be further analyzed for patterns against time and other internal and external environmental factors.

Furthermore, the identified activities and patterns can be used to train models to identify activities in the future, share information about a home with family and friends, trigger smart home devices and services, inspire users to set and maintain goals for how they spend their time, tie in with health tracking services for a more complete picture of activity throughout the day, and/or can be transferred between homes when users travel or move.

For example, an imaging sensor may capture an image and analyze it against a previous image to detect motion in the environment. If there is motion, the image may be sent through the computer vision model to be analyzed for objects and people. Those objects and people in the image may be segmented, e.g., using pixel-wise segmentation and/or bounding boxes of the pixel-regions, and labeled accordingly. The segmentations and labels may be passed to the secondary logic, which analyzes for overlapping objects, pose estimation, television status, as well as other image analyses, and, along with factors such as time of day and day of week, determines if the people in the image are engaging in an activity previously defined by a user or inferred by the secondary logic. This information may then be passed along to a system as an input and to the user.

Note that software that implements at least a portion of the lighting techniques may use a computer vision model to identify objects and people, and secondary logic to identify states of an environment and how people interact with the software (such as recognizing activities and patterns of those activities). This information can then be used as an input to several systems including: residential Internet-of-things, health tracking, assisted living, hospitality and/or quantified-self.

Moreover, images may be collected by the imaging sensor, e.g., a smartphone or standalone IP camera, or another image source observing an environment, such as a living room in a home. The images may be compared against each other to detect motion in the environment. If there is motion in the most recent image, this image may be passed through the computer vision model, locally, on an edge computing device and/or remotely on a cloud-computing device. There, the image may be segmented into pixel regions (e.g., using a bounding box or pixel-wise) that represent people or objects (such as furniture or books) and labeled accordingly. Once the images are segmented, the secondary logic (which is located on the same computing device as the computer vision model and/or on a device remote from that) determines activities based on one or more factors.

For example, activities may be determined based at least in part on whether or not there are people in the environment. Notably, certain activities happen exclusively with people present in an environment and others exclusively without people present. In some embodiments, if a person is not present in a room, that person cannot be watching television in the room. Conversely, a person may turn on a television to listen from another room, such as listening to a news broadcast while cooking breakfast. Consequently, the differentiating factor between 'watching television' and 'cooking breakfast' activities is whether or not a person is in the room with the television while it is on. When pixel regions are segmented and labeled as people, the regions may be further segmented and labeled by body part (such as face and hands) in order to aid or facilitate the further analysis described below.

In addition to occupancy, the activities may be determined based at least in part on the number of people in a room. For example, a family may have four members, so if there are ten people in a room in their home it is very likely that some sort of social gathering is taking place. Moreover, the activities may be determined based at least in part on the location of people in relation to the furniture and other objects in the environment. Notably, if enough of the segmented pixels that define a person are found to be overlapping with enough of the segmented pixels that define a couch, it is very likely that the person is sitting on the couch. Alternatively, if segmented pixels labeled as an open book are in close proximity to or overlapping with segmented pixels labeled as a person, and more specifically that person's hands, it is likely that the person is holding that book, and therefore likely reading the book.

Note that there may be sources of error with overlapping pixel segments, as people may stand, kneel, or lie down near furniture, and thus may appear to be overlapping from the perspective of the imaging sensor. However, in these cases, the people may not be sitting on the furniture. By analyzing the stature of the people found in the image (e.g., standing, sitting, kneeling, or lying down) and combining it with the overlapped pixel analysis, this source of error may be reduced or eliminated and may be a stronger indicating factor of how a person is interacting with the furniture. For example, 'working' and 'taking a nap' activities may be differentiated as sitting versus lying down on the same couch.

Another factor with furniture may be location-based motion analysis using the same technique applied to the image as a whole, but applied to pixel regions defined as specific locations (including furniture). This secondary motion analysis by region may identify more-minute motion within the segmented region that may have been overlooked by the broader image-motion detection. This approach may help corroborate the results from the person-detection model, filtering out false positives of people detected in places they were not detected before without motion in that region (such as the arrival of the person in the region). Similarly, false negatives of people not detected in places they were detected before without motion in that region (such as the person leaving that region) may also be filtered out.

Furthermore, another factor may be whether or not a television or a display is turned on, if one exists in the environment being observed. The secondary logic may identify whether a television, which has been segmented and labeled in an image, is turned on or off using a more-specifically trained machine-learning model. The secondary logic may also analyze the image on the television with a type of motion detection to detect if the content is playing or is paused, which may signify a break in the activity.

Additionally, activities may also be defined by time of day, day of the week or month. People often act in routines and are more likely to do certain activities at certain times of days, which can change between weekdays and weekends. For example, a person may work Monday through Friday 9 am to 5 pm. Consequently, during these time windows, activities at home are not expected. Instead, during the week, post-word activities may occur at home between 6 and 10 pm. However, during the weekend, this individual may be home between 9 am and 5 pm, and may perform certain activities on those days. These expectations may be defined in the lighting system as a user defines activities and/or may be developed by the lighting system as it observes patterns of occupancy and vacancy within an environment.

In some embodiments, activities may be determined by identifying or differentiating among individuals in an environment. For example, an individual may be identified using: face recognition, gait recognition, stature recognition, body-shape recognition, and/or another physical attribute classifier to differentiate among individuals in an environment. This capability may provide for a clear definition of when activities start and end because they can be linked to specific individuals or groups of individuals.

In addition to states of the observed image of the environment, activities may also be defined by external factors, such as: data from other sensors (a thermometer, a barometer, a motion sensor, a light-intensity meter, a microphone, a depth sensor, LiDAR, radar, local weather conditions, holidays or personal calendar events, health statistics from health tracking systems, local traffic patterns, local dynamic energy prices, voice assistant commands, and/or another external factor.

Note that activities in an environment may be determined using one or more of the preceding factors. For example, an individual may define a 'watching television' activity as the room is occupied with that individual sitting on the couch and the television on between 5 pm and 10 pm on weekday nights when that individual does not have a calendar event during that same time. This layered context may provide more specificity that can be used to detect an activity in an environment. Alternatively or additionally, an individual may define a 'family movie' activity as at least four people, all identified to be members of family, in the room, at least two of whom are sitting on the couch with the television on between 6 pm and 10 pm on a Friday, Saturday or Sunday. In some embodiments, one or more states may persistent between two activities, but the combination of all the states may nonetheless differentiates the two activities from each other.

In some embodiments, the activities and the states that define them may be defined by users of the lighting system when they set it up, e.g., via a user interface, such as a smartphone application or another application. For example, the activities may be included in a lighting profile. After a user has defined their activities, the lighting system can identify the activities as they start and stop. Note that activities can also be learned or inferred by the lighting system, as described further below.

Moreover, recognizing an activity may be used as a trigger for external systems, such as residential Internet-of-things setups. For example, if a person starts watching television, the lights can be triggered to dim. Alternatively, if a person is determined to be reading, a light next to the chair that person is in can be triggered to brighten.

In addition to activities, the lighting techniques may also tie reminders to their context rather than simply the time of day or a geographical location. For example, an individual met set a reminder to feed the dog when the dog is detected in the kitchen after work. Or a reminder may be sent to any individual that walks in front of a designated location, such as the refrigerator, between 4 pm and 5 pm to thaw chicken for dinner. In the lighting techniques, the reminders may be provided when they are relevant to the people in the environment based at least in part on where they are and what they are doing. The reminders may be provided using push notifications on mobile or wearable devices or can be relayed through a connected speaker in the same room via a voice assistant, text to speech, or another auditory cue.

The activity recognition capability may allow the lighting system to quantify and report back to people how they interact with their environment, allowing them to think critically about how they spend their time and set goals for themselves. This may be achieved by keeping a record of when activities start and stop in an environment, then sorting by day, week, month, etc.

The activity data may also be analyzed for patterns, e.g., what time of day do people in this environment most frequently watch television, for how long do they watch once they start, and does it change for different days of the week. Patterns may also include what activity is most likely to happen before or after another, or which activities follow or lead to which health statistics of the people doing them. These patterns may be also analyzed by the control hub and/or a cloud-based computer across several environments to discover larger trends common among many individuals.

After activities and patterns are identified and sorted by individual users, the lighting system may identify activities when users start them outside of expected time windows, which may suggest activities when the same interactions are observed over time. This information may be shared with users, such as when the user has set a goal associated with that activity. Note that users can input goals to perform activities more or less frequently, and the lighting system may alert them on progress towards that goal, but may also layer their goals to make suggestions. For example, if a user has a goal to watch less television and to read more, the lighting system may suggest to a user to turn off the television and start reading instead when they are close to the amount of time they have allotted for watching television. In some embodiments, the determined activities may be tied to a health monitoring system. This may allow previously determined activities to be suggested in order to promote positive effects or in order to mitigate adverse effects within a person. These suggestions may be sent as push notifications on mobile and wearable devices, relayed via a connected speaker with a voice assistant, using text to speech, and/or another auditory cue. In some embodiments, a suggestion may be indirect, such as by making a change in the environment to prime the suggested activity (e.g., turning on a reading light to suggest reading).

A caretaker or a guardian may receive prompts to engage the people that they care for. For example, a suggestion to visit an elderly family member may be provided if they have been spending the day doing sedentary activities.

The lighting system may also be used to promote social interactions between friends and family. This may allow a user to share the state of their home with loved ones, but also to trigger invitations to join an activity, such as a text message to friends to come over when a user starts watching a movie, or a message on online message boards when a user starts a multi-player video game.

In some embodiments, user settings (or lighting preferences) may be transferrable between different environments. For example, a user can share their lighting profile (including settings, activities, lighting configurations, lighting states, etc.) with friends and family, so that it may be used in other environments. Users can also bring their lighting profiles with them to new environments or on vacations if instances of the lighting system are available in those environments. Notably, if a user defines a 'watching television' activity as the user sitting on the couch and the television is on between 5 pm and 10 pm on weekdays, when the users come to a new or different environment with a couch and a television, the user can share their activity definition and with a local instance the lighting system in thus environment. Then, when they sit on the couch with the television on between 5 pm and 10 pm, their activity will start, just like in their usual environment. This capability may be used in the hospitality industry and/or the home-sharing market segment.

Many existing control and configuration systems provide very few options or limited to a user. For example, many existing lighting systems provide a user with a list of lighting options, However, it is often difficult to change these options to reflect the preferences or personal tastes of the user, because existing lighting systems are difficult to understand and complicated to use. For example, most users do not understand RGB levels, brightness, color, saturation, scenes, patterns and other arcane descriptions of lighting-configuration parameters. Consequently, the user typically attempts configure a lighting system using unwieldy manual navigation settings, as opposed to natural-language interaction.

Moreover, color and color temperature choices are usually subjective and personal in nature. When an individual says they want the light to be red, there are 256 different shades of red that can meet this requirement, not to mention all the variations of red that occur from combining in various shades of green and blue that are possible. These options provide an enormous number of potential reds for the user to choose from when selecting a red color. Consequently, individual color preferences for red will vary widely, even though the selection options have the same name.

Furthermore, in addition to the task of understanding what a specific individual means when they request a red color, there are other even more subjective tasks related to lighting selections, such as the concepts of 'warmer' and 'cooler.' Warmer and cooler can be understood as individual choices, as well as a collective understanding of what a large group of users desires when attempting to make lighting warmer or cooler.

Therefore, it is desirable to provide a lighting device with the capability to allow users to subjectively describe and save their individual lighting configurations, lighting preferences, lighting states and/or compositions.

In some embodiments of the lighting techniques, machine learning is in conjunction with a lighting system to facilitate lighting control, composition and/or personalization. Note that the lighting system may include one or more distributed, networked components that include lighting devices (such as smart light bulbs and fixtures), a voice interface or detection module, a sensor module, and a control hub. An instance of a lighting device may include wireless communication module for wireless communication within other components in the lighting system.

The machine-learning capability may be included in the control hub and/or a remote cloud-based computer. Initial training and federated data may provide users with the ability to save and to, directly or indirectly, make requests for changes to their lighting parameters and compositions (such as lighting configurations, lighting states and/or lighting preferences). The changes may be subjective in nature and may incorporate the collective understanding of what they mean and/or adaptations for individual preferences. For example, when a human voice command is detected, which provides a subjective command for lighting in the environment using natural language speech, a lighting device and/or the control hub may capture or measure the light spectrum, spatial positions or locations of components in the lighting system and a predefined lighting configuration. Then, the lighting system may use this information as inputs to a machine-learning technique to interpret and/or generate a personalized lighting configuration (which may optionally include lighting states of the lighting devices) for the user. Using this lighting system, the user may not have to perform an action or operation, such as providing additional voice commands and/or feedback.

Note that a given lighting device may include red, green and blue LEDs that each can provide 256 shades of each of these colors. Consequently, the given lighting device may be able to provide 256×256×256 different colors or 16.8M colors. In some embodiments, the given lighting device may include a warm white LED and/or a cool white LED, which may provide the ability to display white in a color temperature ranging from 2700 K to 6500 K.

Moreover, the lighting system may allow a user to speak or provide various commands to an electronic device (such as a cellular telephone), a smart speaker and/or a control hub, so that the user commands can be interpreted and executed to provide desired lighting conditions. In some embodiments, the lighting system may ask questions of the user to more accurately determine what the user wants to accomplish based at least in part on the user's answers. For example, the lighting system may respond to a user request for a hue change, such as 'Please make the living room a warmer blue,' by saying 'Is this better.' Then, if the user answers 'No, can I have a deeper blue,' the lighting system may respond accordingly by modifying the lighting states of one or more of the lighting devices.

Furthermore, a lighting device may include: an interface circuit that wirelessly communicates with other electronic devices (such as a control hub), one or more sensors, a computation unit that executes program instructions, an optional human-interface module (which may receive voice commands that may be processed locally or remotely, such as by a cloud-based computer), and one or more lights. These capabilities allow the lighting device to collect and exchange sensor data, and to be controlled remotely by the control hub.

Additionally, the control hub and/or a remote cloud-based computer may provide lighting control and/or machine-learning capabilities. The control hub and/or the remote cloud-based computer may receive information specifying voice commands from a lighting device, and may perform voice or speech recognition on the voice commands. This analysis may include determining a semantic intent of a user. Then, the control hub and/or the remote cloud-based computer may send appropriate commands to the lighting device to control the lighting states of one or more lights.

In some embodiments, when a human voice command that include natural language speech is detected, the lighting device may capture sensor data from one or more sensors, such as: a light spectrum, locations (or spatial positions) of components in the lighting system and/or any predefined lighting parameters.

Note that the lighting system may execute a personalization process that incorporate inputs, such as: an event/occasion context, light spectrum values (or lighting state) of each light device in a lighting configuration, and/or the voice commands issued by the user. These inputs may be converted into an array of lighting concepts that are stored and then compared to a data structure of interrelated lighting concepts.

Moreover, the lighting system may support different types of lighting configurations, including: scenes, patterns, compositions and/or light shows (and, more generally, spatial and/or temporal lighting states in an environment). Each of these types of lighting configurations types may include: setting one or more lighting devices on or off, information specifying a brightness or intensity of the one or more lighting devices, and/or information specifying color and color temperature of the one or more lighting devices or groups of lighting devices. A machine-learning model in the lighting system may use any of these lighting configurations as inputs, and may generate a response or output based at least in part on the concepts in the data structure and their relationship to the concepts in the inputs in order to provide a personalized lighting configuration and/or lighting states. The personalized lighting configuration and/or lighting states may match a user's lighting preferences for color, color temperature and/or brightness or intensity for each of the one or more light devices in the lighting configuration.

Furthermore, the lighting system may remember the user's lighting preferences and may intelligently ask for user feedback (such as 'more blue,' 'warmer,' 'great for a dinner party,' etc.) in order to further train the lighting system. This natural language feedback may be converted to numerical values before processing occurs. Once the processing is completed, a numerical output result may be converted into natural language. In the lighting system, much of the processing may be independent of the natural language. Because input language is converted into a numerical representation of lighting concepts, syntax rules may not, for the most part, be taken into account when an input is analyzed. This may make the lighting system more responsive. Note that the lighting system may include a table of lighting concepts that are assigned predetermined weights. These lighting concepts may include words such as: 'cooler,' 'less green,' 'moodier,' 'more bright,' 'a [brand] lighting,' etc. When a new lighting concept is created and added to the data structure, the weight of the lighting concept may be calculated or may be assigned a default weight. For example, the default weight may be the average weight of the other stored lighting concepts.

Additionally, the lighting system may allow a user to define lighting concepts, define event/occasions concepts, mood concepts and/or to define relationships between these lighting concepts. Note that different lighting concepts in the lighting concept data structure may be related to each other.

For example, the lighting concept 'Sarah dinner lighting' may be related to the lighting concept 'romantic date night lighting,' because they represent similar ideas of an event/occasion. Alternatively, the lighting concept 'warmer' may be related to the lighting concept 'yellow,' because yellow may be considered a warm color. These relationships may be created or defined by the user when a new lighting concept is added to the lighting system, or they may be created by the lighting system based on a context of one or more lighting concepts in the data structure or an external source. Relationships may also be obtained from a data structure such as: a dictionary, a thesaurus, or may be initially trained using crowd-sourced resources.

In some embodiments, the lighting system may automatically detect a new lighting device in an environment and may dynamically include it within an existing light configuration to comport with the individual specifications for similar lighting devices in the lighting configuration. Moreover, the lighting state for a new lighting device may be based at least in part on the lighting preferences of an individual for the lighting configuration.

Note that when the lighting system determines that there is not a strong match for a requested lighting composition, the lighting system may search existing lighting patterns stored by the lighting system for a lighting pattern that closely resembles the conceptual composition requested by the user. One or more lighting patterns that most closely resemble the requested conceptual composition may be selected for presentation to the user. The user's subsequent interaction with a user interface and selection(s) may be used to further fine-tune the training for the conceptual composition.

Moreover, the lighting system may capture and learn over time, both directly and indirectly, the user's lighting preferences for temporally: turning lights on or off in particular environments (such as a room, indoors, outdoors, etc.), setting brightness or intensities, color, and/or color temperature. For example, the lighting system may provide blue colored light in the morning and orange colored light in the afternoon. Alternatively or additionally, the lighting states (such as the light colors) may match an individual's current circadian rhythm (which is a type of context), which may be inferred from one or more measurements (such as the individual's sleep and/or activity patterns). The lighting preferences may depend on the time of day, the day of the week, a special occasion, a recurring event, etc.

Furthermore, the lighting system may use a lighting behavior history of a user to specify the user's prior lighting preferences. For example, the lighting system may suggest to a user 'It's happy hour, do you like this wind-down lighting composition?' The user may respond 'Yeah, maybe a little dimmer.' This capability may also be used as an interactive tool for users who are interested in understanding possible lighting configurations and/or lighting states.

Additionally, one or more instances of the lighting system may be trained by different individuals in order to add as much information to the data structures. The various data structures of the different instances of the lighting systems may then be merged into a single anonymous data structure in order to allow the lighting system to contain a large amount of data and to be able to respond to a wider variety of lighting concepts and inputs more intelligently.

Lighting fixtures and bulbs come in a large variety of types and styles and can be placed practically anywhere in a room. This flexibility creates a large number of options for selecting, planning and placing lighting within a room.

In principle, augmented and virtual reality (and, more generally, representations) allow virtual objects that appear natural and convincing within their real-world environments. Many of these approaches try to accurately render the virtual objects more effectively by considering the real-world physical lighting for the virtual objects (such as by using lighting sensors) and then re-creating or reconstruction the lighting condition(s). However, without addressing these rendering issues, the virtual object may appear unnatural or out-of-place when included in a representation of the physical environment. This can be challenging given the large number of possible lighting configurations.

In some embodiments of the lighting techniques, augmented or virtual reality are used to facilitate the design of a lighting configuration for an environment. For example, an electronic device with a display and an imaging sensor may allow augmented or virtual reality representations of the environment to be created and displayed. These augmented or virtual reality representations may virtually indicate the visual effects of a lighting configuration on physical objects and the environment.

As noted previously, a lighting device may include: an interface circuit that wirelessly communicates with other electronic devices (such as a control hub), one or more sensors, a computation unit that executes program instructions, an optional human-interface module (which may receive voice commands that may be processed locally or remotely, such as by a cloud-based computer), and one or more lights. Moreover, a synthesized virtual representation of an environment (such as 3D digital representation) may be constructed based on predefined light characteristics (or calibration results) of the lighting devices and the lighting configuration of the lighting devices in the environment. For example, the light characteristics may include: a shape of a light, a direction of the light, a color and hue of the light, an intensity of the light, the coherence or diffusion properties of the light, and/or a spatial position or location of the light. The effects of lighting on an environment may be determined by the one or more light characteristics. Consequently, by using the augmented or virtual reality representations, the lighting techniques may allow or may facilitate the selection and placement of the lighting devices in the environment. Notably, the lighting techniques may allow a user to visualize a variety of design options, so that they can select a desired lighting configuration.

Moreover, as noted previously, a given lighting device may include red, green and blue LEDs that each can provide 256 shades of each of these colors. Consequently, the given lighting device may be able to provide 256×256×256 different colors or 16.8M colors. In some embodiments, the given lighting device may include a warm white LED and/or a cool white LED, which may provide the ability to display white in a color temperature ranging from 2700 K to 6500 K. Thus, the given lighting device may provide an arbitrary intensity, brightness and/or saturation.

Using augmented reality as an illustration, in some embodiments an augmented reality application may present digital or virtual image information as an augmentation to the visualization of an image of the physical environment. Digitally images or portions of this image may be presented to a user in a manner that may be perceived as a 'real' representation of a physical environment, such as a park, a building, a home or a room.

Furthermore, the lighting techniques may provide an augmented reality application that allows a user to rapidly and simply select from multiple lighting options, spatially place their selections into the image of the real-world environment of their home and/or room, and to be able to visualize the end effect of this lighting and location combination (or lighting configuration) on the physical environment. Synthesized lighting characteristics may be created for application to a real-world physical environment within an augmented reality application. Additionally, by using an imaging sensor (such as the camera in a cellular telephone) in conjunction with a control application (or user interface) for the lighting system, a user can capture one or more images corresponding to a field-of-view of the environment, and can view the effect of new lighting configurations in a given environment. Note that applying an augmented reality overlay may enable a user to envision the effect of different types of lights, as well as their lighting constructs, on each part of the environment in which they are placed.

In some embodiments, an augmented reality application may reside on an electronic device (such as a cellular telephone), in a control hub and/or a cloud-based computer.

Moreover, in some embodiments, the lighting system may use multiple images as a depth sensing technique by assigning a depth value and a color value to create a 3D model or representation of the physical environment.

Furthermore, the augmented reality application may allow a user to select in an intuitive manner from multiple lighting configurations or options and to place the selected components in a captured image of the environment. In some embodiments, the augmented reality application may automatically suggest new lighting devices for an environment (such as based at least in part on a context), and may dynamically include the lighting devices within an existing lighting configuration to comport with the user specifications for similar lighting devices in the light configuration. In addition, the lighting configuration may comport with or match the lighting preferences of an individual.

Additionally, the lighting configuration in the representation of the environment may be dynamically sized or scaled to the estimated environment dimensions or layout.

In some embodiments, the augmented reality application may apply an augmented reality overlay visual to the user, thereby allowing the user to place the virtual chosen lighting configuration or options anywhere within an image of the physical environment. This capability may enable a user to envision the effect of different types of lights, as well as their lighting characteristics, on each part of the environment in which the lights are placed. This capability may provide a relative spatial position between the various virtual lighting objects, thereby synthesizing the composite lighting effect produced in the augmented reality display.

Note that the augmented reality application may provide a recommendation to the user to help the user fine-tune their lighting preferences. Moreover, each saved output augmented reality display image of the iterative design process may be converted into an array of lighting concepts, which may be stored and then compared to a data structure of interrelated lighting concepts. The rendering of potential synthesized lighting characteristics can be iterated over time to more accurately determine a desired individualized lighting environment.

Moreover, in some embodiments, a pretrained machine-learning model may be used to help a user design a lighting configuration for an environment. The machine-learning model may evaluate training data as well as the user's previous choices in a lighting behavior history.

Furthermore, one or more similar or related environments may be determined using a pretrained machine-learning model. For example, the user's environment may be evaluated across a number of parameters, including: size, lighting-device location(s), proximity of the light to corners in the environment, other light sources, furniture and other objects within the field-of-view, etc. Then, the pretrained machine-learning model may determine the type of room. This information may be used to narrow the set of possible related environments. Additionally, the pretrained machine-learning model may evaluate the lighting behaviors of the set of possible related environments relative to the characteristic of the user's environment in order to recommend a subset of related environments. Notably, match scores for the characteristics of the environment and the related environments may be computed and ranked. The subset of related environments may be the top-N of the ranking, where N is an integer. Note that the lighting configurations of the related environment(s) may be used to help select the lighting configuration for the environment.

What constitutes the best lighting options for an environment is usually subjective, because there is often no absolute measure of what constitutes best lighting. This is one of the challenges and opportunities of smart lighting. Consequently, inputs to a pretrained machine-learning model may include objective data on illumination, reflection, etc., as well as more subjective criteria, such as one or more users' previous lighting preferences, lighting configuration and/or lighting states in a lighting behavior history in the environment and/or related environments.

In some embodiments, the pretrained machine-learning model may learn a user's personal lighting preferences over time and may overlay these lighting preferences on the recommendations of the augmented reality application in order to obtain results that more likely match a user's tastes.

We now describe embodiments of an electronic device. FIG. 11 presents a block diagram illustrating an electronic device 1100, such as control hub 110, one of lighting devices 112, computer 114, electronic device 116, optional base station 128 or optional access point 132 in FIG. 1. This electronic device includes processing subsystem 1110, memory subsystem 1112, networking subsystem 1114, feedback subsystem 1126 and lighting subsystem 1132. Processing subsystem 1110 includes one or more devices configured to perform computational operations. For example, processing subsystem 1110 can include one or more microprocessors, one or more application-specific integrated circuits (ASICs), one or more microcontrollers, one or more programmable-logic devices, one or more GPUs and/or one or more digital signal processors (DSPs).

Memory subsystem 1112 includes one or more devices for storing data and/or instructions for processing subsystem 1110 and networking subsystem 1114. For example, memory subsystem 1112 can include dynamic random access memory (DRAM), static random access memory (SRAM), and/or other types of memory. In some embodiments, instructions for processing subsystem 1110 in memory subsystem 1112 include: one or more program modules or sets of instructions (such as program instructions 1122 or operating system 1124), which may be executed by processing subsystem 1110. Note that the one or more computer programs may constitute a computer-program mechanism. Moreover, instructions in the various modules in memory subsystem 1112 may be implemented in: a high-level procedural language, an object-oriented programming language, and/or in an assembly or machine language. Furthermore, the programming language may be compiled or interpreted, e.g., configurable or configured (which may be used interchangeably in this discussion), to be executed by processing subsystem 1110.

In addition, memory subsystem 1112 can include mechanisms for controlling access to the memory. In some embodiments, memory subsystem 1112 includes a memory hierarchy that comprises one or more caches coupled to a memory in electronic device 1100. In some of these embodiments, one or more of the caches is located in processing subsystem 1110.

In some embodiments, memory subsystem 1112 is coupled to one or more high-capacity mass-storage devices (not shown). For example, memory subsystem 1112 can be coupled to a magnetic or optical drive, a solid-state drive, or another type of mass-storage device. In these embodiments, memory subsystem 1112 can be used by electronic device 1100 as fast-access storage for often-used data, while the mass-storage device is used to store less frequently used data.

Figure 12:
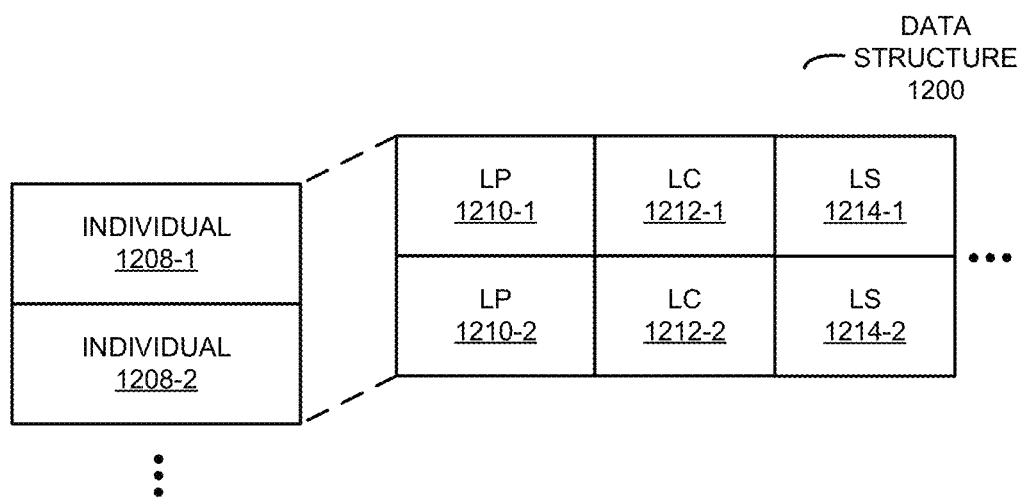
FIG. 12 is a block diagram illustrating a data structure for use in conjunction with the electronic device of FIG. 11 in accordance with an embodiment of the present disclosure.

Memory subsystem 1112 may store information that is used during the lighting techniques. This is shown in FIG. 12, which presents a block diagram illustrating a data structure 1200 for use in conjunction with electronic device 1100 (FIG. 11). This data structure may include, for different individuals 1208: one or more lighting preferences (LP) 1210, one or more lighting configurations (LC) 1212, and/or one or more lighting states (LS) 1214.

In other embodiments, the order of items in data structure 1200 can vary and additional and/or different items can be included. Moreover, other sizes or numerical formats and/or data can be used.

Referring back to FIG. 11, networking subsystem 1114 includes one or more devices configured to couple to and communicate on a wired and/or wireless network (i.e., to perform network operations), including: control logic 1116, an interface circuit 1118, one or more antennas 1120 and/or input/output (I/O) port 1130. (While FIG. 11 includes one or more antennas 1120, in some embodiments electronic device 1100 includes one or more nodes 1108, e.g., a pad, which can be coupled to one or more antennas 1120. Thus, electronic device 1100 may or may not include one or more antennas 1120.) For example, networking subsystem 1114 can include a Bluetooth networking system, a cellular networking system (e.g., a 3G/4G/11G network such as UMTS, LTE, etc.), a universal serial bus (USB) networking system, a networking system based on the standards described in IEEE 802.11 (e.g., a Wi-Fi networking system), an Ethernet networking system, and/or another networking system.

Networking subsystem 1114 includes processors, controllers, radios/antennas, sockets/plugs, and/or other devices used for coupling to, communicating on, and handling data and events for each supported networking system. Note that mechanisms used for coupling to, communicating on, and handling data and events on the network for each network system are sometimes collectively referred to as a 'network interface' for the network system. Moreover, in some embodiments a 'network' between the electronic devices does not yet exist. Therefore, electronic device 1100 may use the mechanisms in networking subsystem 1114 for performing simple wireless communication between the electronic devices, e.g., transmitting advertising or beacon frames and/or scanning for advertising frames transmitted by other electronic devices as described previously.

Within electronic device 1100, processing subsystem 1110, memory subsystem 1112, and networking subsystem 1114 are coupled together using bus 1128. Bus 1128 may include an electrical, optical, and/or electro-optical connection that the subsystems can use to communicate commands and data among one another. Although only one bus 1128 is shown for clarity, different embodiments can include a different number or configuration of electrical, optical, and/or electro-optical connections among the subsystems.

In some embodiments, electronic device 1100 includes a feedback subsystem 1126 that provides or presents information (such as a user interface, an augmented or a virtual reality image, a recommendation, etc.) to a user of electronic device 1100. For example, feedback subsystem 1126 may include a display subsystem that displays the information on a display, which may include a display driver and the display, such as a liquid-crystal display, a multi-touch touchscreen, etc.

Moreover, lighting subsystem 1132 may include one or more types of lights (such as one or more LEDs) and/or one or more sensors (such as one or more imaging sensors). Note that the one or more imaging sensors may acquire or capture one or more images (with 2D or 3D information).

Electronic device 1100 can be (or can be included in) any electronic device with at least one network interface. For example, electronic device 1100 can be (or can be included in): a desktop computer, a laptop computer, a subnotebook/netbook, a server, a mainframe computer, a cloud-based computer system, a tablet computer, a smartphone, a cellular telephone, a smart watch, a headset, electronic or digital glasses, headphones, a consumer-electronic device, a portable computing device, an access point, a router, a switch, communication equipment, test equipment, a wearable device or appliance, a headset, a display, and/or another electronic device.

Although specific components are used to describe electronic device 1100, in alternative embodiments, different components and/or subsystems may be present in electronic device 1100. For example, electronic device 1100 may include one or more additional processing subsystems, memory subsystems, networking subsystems, and/or feedback subsystems (such as an audio subsystem). Additionally, one or more of the subsystems may not be present in electronic device 1100. Moreover, in some embodiments, electronic device 1100 may include one or more additional subsystems that are not shown in FIG. 11. Also, although separate subsystems are shown in FIG. 11, in some embodiments, some or all of a given subsystem or component can be integrated into one or more of the other subsystems or component(s) in electronic device 1100. For example, in some embodiments program instructions 1122 are included in operating system 1124.

Moreover, the circuits and components in electronic device 1100 may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

An integrated circuit may implement some or all of the functionality of networking subsystem 1114, such as a radio. Moreover, the integrated circuit may include hardware and/or software mechanisms that are used for transmitting wireless signals from electronic device 1100 and receiving signals at electronic device 1100 from other electronic devices. Aside from the mechanisms herein described, radios are generally known in the art and hence are not described in detail. In general, networking subsystem 1114 and/or the integrated circuit can include any number of radios. Note that the radios in multiple-radio embodiments function in a similar way to the described single-radio embodiments.

In some embodiments, networking subsystem 1114 and/or the integrated circuit include a configuration mechanism (such as one or more hardware and/or software mechanisms) that configures the radio(s) to transmit and/or receive on a given communication channel (e.g., a given carrier frequency). For example, in some embodiments, the configuration mechanism can be used to switch the radio from monitoring and/or transmitting on a given communication channel to monitoring and/or transmitting on a different communication channel. (Note that 'monitoring' as used herein comprises receiving signals from other electronic devices and possibly performing one or more processing operations on the received signals, e.g., determining if the received signal comprises an advertising frame, receiving the input data, etc.)

While communication protocols compatible with Ethernet, Wi-Fi and a cellular-telephone communication protocol were used as illustrative examples, the described embodiments of the lighting techniques may be used in a variety of network interfaces. Furthermore, while some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the lighting techniques may be implemented using program instructions 1122, operating system 1124 (such as a driver for interface circuit 1118) and/or in firmware in interface circuit 1118. Alternatively or additionally, at least some of the operations in the lighting techniques may be implemented in a physical layer, such as hardware in interface circuit 1118.

In the preceding description, we refer to 'some embodiments.' Note that 'some embodiments' describes a subset of all of the possible embodiments, but does not always specify the same subset of embodiments. Moreover, note that the numerical values provided are intended as illustrations of the lighting techniques. In other embodiments, the numerical values can be modified or changed.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A computer, comprising:
   an interface circuit;
   a computation device, coupled to the interface circuit and memory, configured to execute program instructions;
   the memory configured to store the program instructions, wherein, when executed by the computation device, the program instructions cause the computer system to perform one or more operations comprising:

providing, based at least in part on an initial lighting preference of an individual and federated data of multiple other individuals, and addressed to one or more lights in an environment, instructions specifying initial lighting states of the one or more lights in a lighting configuration in the environment, wherein the initial lighting states are provided by a pretrained machine-learning model or a neural network, wherein the lighting configuration comprises the one or more lights at predefined or predetermined locations in the environment, and wherein an initial lighting state of a given light comprises an intensity and a color of the given light;

receiving sensor data specifying a non-verbal physical response of the individual to initial lighting states of the one or more lights;

determining, based at least in part on the non-verbal physical response, a type of reaction of the individual to the initial lighting state; and selectively modifying, based at least in part on a lighting behavior history of the individual and the determined type of reaction, the initial lighting preference of the individual to obtain an updated lighting preference, wherein the selective modifying comprises dynamic learning or retraining of the pretrained machine-learning model or the neural network in order to customize lighting states from those of the multiple individuals to personalized and context-dependent lighting states of the individual.

2. The computer of claim 1, wherein the one or more operations comprise providing, based at least in part on the updated lighting preference and addressed to the one or more lights, second instructions specifying second lighting states of the one or more lights in the lighting configuration in the environment; and wherein the second lighting states are different from the initial lighting states.

3. The computer of claim 2, wherein the instructions or the second instructions are provided via a control hub.

4. The computer of claim 1, wherein the sensor data comprises: an image or a video of at least a portion of the individual; or sound.

5. The computer of claim 4, wherein the determining of the non-verbal physical response comprises analyzing the image or the video using an image-processing technique.

6. The computer of claim 1, wherein the initial lighting preference is modified when the type of reaction is negative, and whether the type of reaction is negative is based at least in part on a threshold value.

7. The computer of claim 1, wherein the lighting behavior history comprises prior instances of verbal or natural-language commands corresponding to prior lighting states of one or more lighting configurations associated with the individual, feedback about the prior lighting states of the one or more lighting configurations associated with the individual, or both.

8. The computer of claim 7, wherein the feedback comprises changes to the prior lighting states of the one or more lighting configurations.

9. The computer of claim 1, wherein the determining of the type of reaction and the modifying of the initial lighting preference involve a generative adversarial network (GAN).

10. The computer of claim 1, wherein the non-verbal physical response comprises: a facial expression, a gesture, posture, gait, motion, a gaze or viewing direction, a viewing distance relative to printed material or a display, an eyebrow position, or a pupil response.

11. The computer of claim 1, wherein the non-verbal physical response comprises a type of sound other than a verbal or natural-language command associated with the individual.

12. The computer of claim 1, wherein the receiving of the sensor data comprises measuring the sensor data.

13. A non-transitory computer-readable storage medium for use in conjunction with a computer, the computer-readable storage medium configured to store program instructions that, when executed by the computer, causes the computer to perform one or more operations comprising:

providing, based at least in part on an initial lighting preference of an individual and federated data of multiple other individuals, and addressed to one or more lights in an environment, instructions specifying initial lighting states of one or more lights in a lighting configuration in the environment, wherein the initial lighting states are provided by a pretrained machine-learning model or a neural network, wherein the lighting configuration comprises the one or more lights at predefined or predetermined locations in the environment, and wherein an initial lighting state of a given light comprises an intensity and a color of the given light;

receiving sensor data specifying a non-verbal physical response of the individual to initial lighting states of the one or more lights;

determining, based at least in part on the non-verbal physical response, a type of reaction of the individual to the initial lighting state; and selectively modifying, based at least in part on a lighting behavior history of the individual and the determined type of reaction, the initial lighting preference of the individual to obtain an updated lighting preference, wherein the selective modifying comprises dynamic learning or retraining of the pretrained machine-learning model or the neural network in order to customize lighting states from those of the multiple individuals to personalized and context-dependent lighting states of the individual.

14. The non-transitory computer-readable storage medium of claim 13, wherein the sensor data comprises an image or a video, and the determining of the non-verbal physical response comprises analyzing the image or the video using an image-processing technique.

15. The non-transitory computer-readable storage medium of claim 13, wherein the initial lighting preference is modified when the type of reaction is negative, and whether the type of reaction is negative is based at least in part on a threshold value.

16. The non-transitory computer-readable storage medium of claim 13, wherein the lighting behavior history comprises prior instances of verbal or natural-language commands corresponding to prior lighting states of one or more lighting configurations associated with the individual, feedback about the prior lighting states of the one or more lighting configurations associated with the individual, or both.

17. The non-transitory computer-readable storage medium of claim 13, wherein the non-verbal physical response comprises: a facial expression, a gesture, posture, gait, motion, a gaze or viewing direction, a viewing distance relative to printed material or a display, an eyebrow position, or a pupil response.

18. A method for dynamically learning a lighting preference of an individual, comprising:

by a computer:

providing, based at least in part on an initial lighting preference of the individual and federated data of multiple other individuals, and addressed to one or more lights in an environment, instructions specifying initial lighting states of one or more lights in a lighting configuration in the environment, wherein the initial lighting states are provided by a pretrained machine-learning model or a neural network, wherein the lighting configuration comprises the one or more lights at predefined or predetermined locations in the environment, and wherein an initial lighting state of a given light comprises an intensity and a color of the given light;

receiving sensor data specifying a non-verbal physical response of the individual to initial lighting states of the one or more lights;

determining, based at least in part on the non-verbal physical response, a type of reaction of the individual to the initial lighting state; and selectively modifying, based at least in part on a lighting behavior history of the individual and the determined type of reaction, the initial lighting preference of the individual to obtain an updated lighting preference, wherein the selective modifying comprises dynamic learning or retraining of the pretrained machine-learning model or the neural network in order to customize lighting states from those of the multiple individuals to personalized and context-dependent lighting states of the individual.

19. The method of claim 18, wherein the sensor data comprises an image or a video, and the determining of the non-verbal physical response comprises analyzing the image or the video using an image-processing technique.

20. The method of claim 18, wherein the initial lighting preference is modified when the type of reaction is negative.

* * * * *